United States Patent
Carver

Patent Number: 5,748,753
Date of Patent: May 5, 1998

[54] HIGH POWER AUDIO SUBWOOFER

[76] Inventor: Robert W. Carver, 330 Avenue A., Snohomish, Wash. 98290

[21] Appl. No.: 582,149

[22] Filed: Jan. 2, 1996

[51] Int. Cl.$^6$ .................................................. H04R 3/00
[52] U.S. Cl. ........................ 381/96; 381/89; 381/96; 381/195; 381/120
[58] Field of Search ................. 381/55, 89, 195, 381/194, 96, 120, 121, 193

[56] References Cited

U.S. PATENT DOCUMENTS

| | | | |
|---|---|---|---|
| 4,130,725 | 12/1978 | Nagel | 381/120 |
| 4,218,660 | 8/1980 | Carver | 330/297 |
| 4,327,257 | 4/1982 | Schwartz | 381/199 |
| 4,783,820 | 11/1988 | Lyngdorf et al. | 381/89 |

*Primary Examiner*—Curtis Kuntz
*Assistant Examiner*—Duc Nguyen
*Attorney, Agent, or Firm*—J. Robert Cassidy, P.S.

[57] ABSTRACT

A subwoofer including a walled cabinet defining an enclosed space of less than 1 cubic foot; axial openings formed in two opposed cabinet walls; and, two driver assemblies mounted within the cabinet on a common axis with the wall openings. Each driver assembly includes: a base; a magnetic pole coaxial with the common axis; an annular magnet surrounding the pole and defining therewith an annular magnetic gap therebetween; a frame coaxial with the common axis and secured at one end to the magnet with its opposite end lying in a plane proximate to the plane of the opening in the adjacent cabinet wall; a cylindrical voice coil former mounted within the magnetic gap and axially moveable relative thereto; a pair of separate voice coils wound about the former with freedom for axial movement within the magnetic gap; a cone having its large diameter end lying in a plane containing the free end of the frame and an apical end coupled to one end of the former; and, a resilient suspension for coupling the cone and former to the frame with freedom for axial movement through a peak-to-peak stroke of approximately 2.5". Positive and negative signal amplifiers having inputs and outputs are provided with their outputs coupled to respective different ones of the voice coils. An audio signal processor including a power supply is coupled to the inputs of the amplifiers for alternately energizing the voice coils during positive and negative voltage swings of the audio signal.

17 Claims, 13 Drawing Sheets

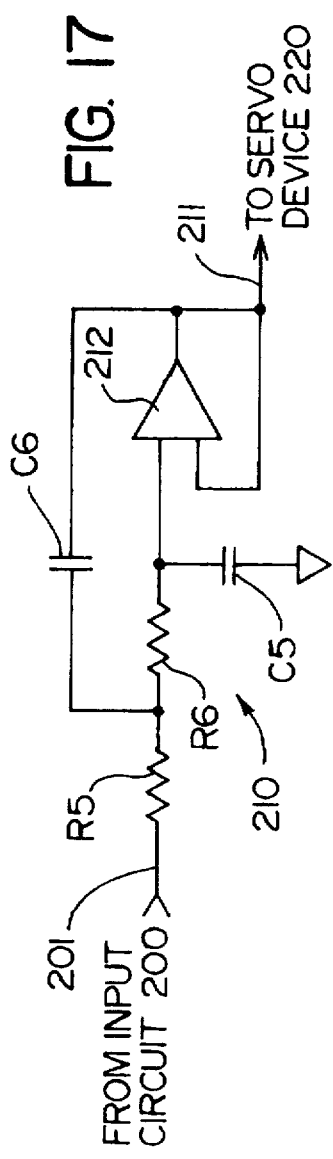
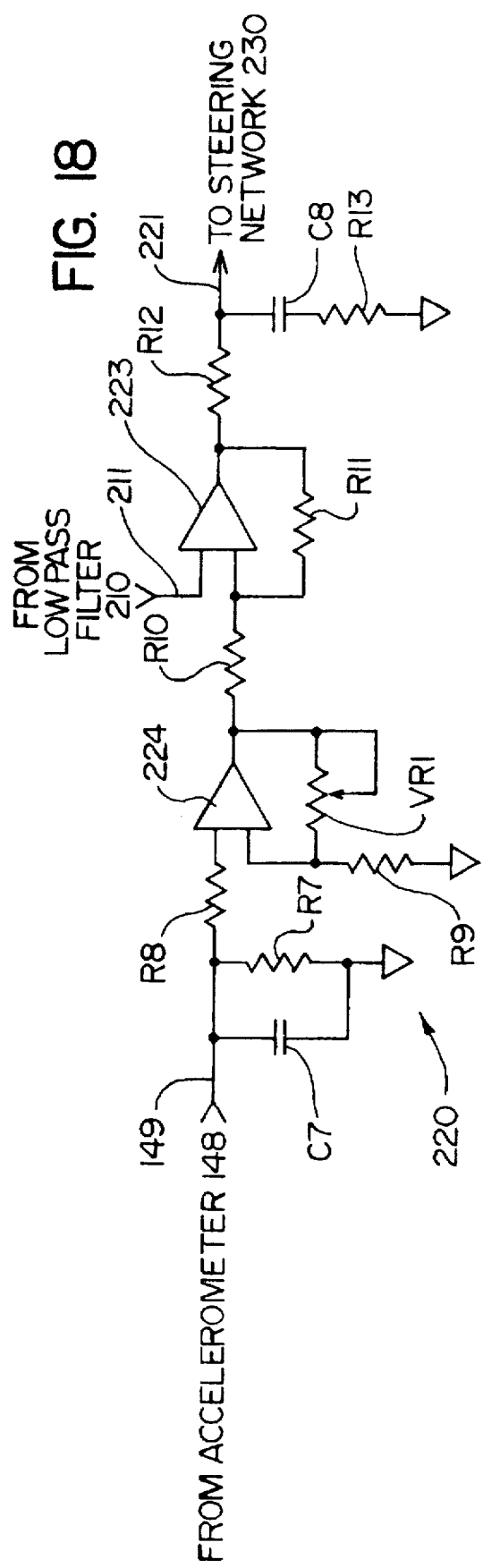

HIGH POWER AUDIO SUBWOOFER

BACKGROUND OF THE INVENTION

1. Field of the Invention

The present invention relates generally to the field of high fidelity audio reproduction; and, more particularly, concerns subwoofer loudspeaker systems that produce high quality, low distortion and low-frequency sound.

2. Prior Art

In the field of high fidelity sound reproduction, a high quality audio system is normally comprised of: a) a signal source, which is generally music or soundtracks from: i) films; ii) compact disk players; iii) laser disk players, and the like; b) a "preamplifier" which receives the signal source and provides an audio signal to a power amplifier which amplifies the signal; and c), loudspeakers that can reproduce the sound from the signal source. Generally, loudspeakers are single enclosures designed to produce most of the audible frequency range, which is from 20 Hertz to 20,000 Hertz.

Modern recording technologies have allowed music and film producers to make recordings having wider dynamic ranges—i.e., higher signal-to-noise ratios—and more extended frequency response. Furthermore, many music and film recordings contain more low frequency information that those of only a few years ago. This is especially true in film soundtracks, where recordings of special effects such as explosions are commonplace.

In response to the increased low frequency sound in recordings, a growing number of audio systems are adding an additional type of loudspeaker to their existing array of loudspeakers. This type of loudspeaker is known as a "subwoofer". Subwoofers are specialized loudspeakers which reproduce only the lowest frequencies of the audible frequency range—viz., those frequencies ranging from approximately 20 Hertz to about 80 to 120 Hertz. These low frequencies are difficult for many full range loudspeakers to reproduce because the bass drivers for full range loudspeakers must handle a wider frequency range—i.e., their frequency response must extend much higher in the audible frequency range, often to about 2,500 Hertz or even higher depending upon the design of the loudspeaker. Adding a subwoofer to an audio system relieves the full range loudspeaker from reproducing the lowest frequencies, thereby improving its performance. In addition, certain standards are being set for the reproduction of film soundtracks at home which require the use of one or more subwoofers. Such standards include THX® (a registered trademark of Lucas Film, Ltd.) certification from LucasFilm and Dolby AC-3 Surround Sound® (a registered trademark of J. C. Penney Company Inc.) from Dolby Laboratories. Dolby AC-3 Surround Sound® even has an audio channel dedicated to only low frequency information.

Conventional design of a subwoofer involves the placement of one or more large bass drivers into a large cabinet—e.g., typically a cabinet enclosing a volume of space ranging from about 8 cubic feet to about 10 cubic feet. Bass drivers, known as "woofers", generally include a circular "diaphragm" or "cone" which can be constructed of many different materials including paper, plastic, kevlar, etc. Woofer cones have a certain diameter—viz., the bore of the cone is equal to pi×radius². Prior art subwoofer cones capable of high acoustic output generally have a diameter of at least ten inches, and often greater.

The circumference of the cone is affixed to a "surround" or "suspension", which is then affixed to the driver's frame. The suspension enables the cone to move in and out of the driver frame at a particular frequency and returns it to a null position when no sound is produced. The peak-to-peak distance traveled by the cone is known as the "stroke" of the driver. Generally, the drivers installed in prior art subwoofers have a stroke of between 0.6" and 0.8". Prior art suspensions are constructed of flexible, compliant materials such as rubber or impregnated cloth which produce very little resistance to peak-to-peak cone movement.

Movement of the cone about the suspension causes air to be moved, which is what produces the sound heard and, in the case of bass, felt by the listener. The amount of air that can be moved by a driver is directly related to the bore and stroke of the subwoofer cone. Thus, to increase the amount of air that a subwoofer can move, the bore, the stroke, and/or both the bore and stroke, can be increased. However, and as will be discussed below, simply increasing the bore and/or the stroke has disadvantages.

At the center of the cone, the driver is affixed to the "motor" of the cone which is comprised generally of a single electrical conductor placed within a magnetic field. In the prior art, the electrical conductor is a single electrical wire wrapped around a cylinder. This arrangement is know as the voice coil of the driver. The voice coil is wrapped around a voice coil former which is, in turn, affixed to the cone of the driver and placed in proximity to a magnet. When current is run through the voice coil, magnetic fields are created around the voice coil. These voice coil magnetic fields interact with the magnetic fields of the magnet, which causes the voice coil former to move. The voice coil former's movement causes the movement of the cone. Cone movement, as discussed above, causes the movement of air which produces sound. Producing sound at higher volumes requires greater cone movements. Greater cone movements are produced when the voice coil and the driver's magnet have greater magnetic field interactions; and, this increased magnetic filed interaction is produced when the voice coil has more current running through it.

To reproduce low frequencies at high volume levels, a subwoofer must be capable of moving large quantities of air. Typical prior art subwoofers for use in the home can move approximately one-hundred thirty cubic inches of air. For louder audio volumes, it is desirable that the subwoofer be capable of moving even more air—for example, one-hundred eighty cubic inches of air. A typical fifteen inch diameter woofer, which has a cone diameter of approximately thirteen inches and a stroke of approximately 0.6 inches, can move approximately eighty cubic inches of air. Therefore, generally a prior art subwoofer will utilize two of these drivers; and two drivers are able to move approximately one-hundred sixty cubic inches of air. One disadvantage of having a driver with a thirteen inch cone is that is difficult to design a cone that it is rigid enough to resist distortion when the cone has such a large surface area.

Another example of a prior art subwoofer utilizes four twelve inch drivers. Each of these drivers has a cone diameter of approximately ten inches and a stroke of approximately 0.6 inches. Such a subwoofer can move approximately one-hundred ninety cubic inches of air. However, such a subwoofer suffers from the disadvantage that four drivers are required; and, this greatly increases the size of the cabinet required, cost and weight.

Of course, it is possible to increase the stroke of the driver, and thus increase the amount of air that is moved by the driver. However, when the stroke of the driver is increased, the efficiency of the driver is substantially reduced, as less of the voice coil will remain in the magnetic gap.

Prior art subwoofer systems invariably require a large cabinet. One reason, as seen from the above, is that many prior art subwoofer systems utilize several large drivers so that they can move enough air for adequate performance. However, large cabinets are necessary for prior art subwoofers for reasons having nothing to do with the number of drivers installed therein. Some of the more significant reasons for this are set forth hereinbelow. Drivers for subwoofers are generally installed in a sealed or vented box. Thus, when the cone of the driver moves, it must overcome the forces inherently created because of the box structure itself. For instance, during operation, if the cone is moving into the cabinet, the air inside the cabinet will be compressed by the moving cone, thereby creating a force resisting inward cone movement. If, on the other hand, the cone is moving out of the cabinet, a vacuum is created that, in effect, exerts a force tending to pull the cone back into the cabinet. These conditions exist for both sealed and vented boxes or cabinets. Atmospheric pressures outside the cabinet also affect these forces.

The driver must overcome the foregoing forces during movement of the cone. The higher the pressure to be overcome (whether positive or negative), the more power that is required to overcome them. The physical structure of the subwoofer can be manipulated to deal with the increase in power that is required to overcome the foregoing forces. First, a larger enclosure (i.e. cabinet) can be used. A larger enclosure will create less resistance to inward and outward cone movements because it contains more air than a smaller enclosure. The reason for this is that when the driver cone moves into the cabinet, the larger air volume is compressed to a lower pressure. Thus, less power is required by the voice coil to overcome the forces created by the compression of air within the cabinet. Further, when the driver cone moves out of the cabinet, less vacuum is created, which therefore allows the voice coil to move the cone with less power. Because of this, prior art subwoofers have typically required relatively large cabinets.

A second design factor is related to the stroke of the driver. If the stroke of the driver is short, the driver cone will have physical limitations on how far it can enter into the cabinet and how far it can extend outwardly from the cabinet. The shorter the extension of the driver cone into the cabinet, the less air that will be compressed within the cabinet Such a movement will, therefore, require less power into the voice coil to effectuate movement of the cone. The same holds true for cone extension out of the cabinet. The shorter the extension of the driver cone out of the cabinet, the less will be the vacuum that is created and, therefore, the less power that will be required for such cone movement.

Power in prior art subwoofer systems must be provided by power amplifiers. Often a subwoofer system will use a separate power amplifier. However, for ease of packaging, many prior art subwoofer systems utilize power amplifiers that are built into the cabinet of the subwoofer. In general, power amplifiers capable of driving conventional prior art subwoofers must be large and capable of creating between one-hundred (100) to three-hundred (300) watts of power. Large amounts of power are required to drive a subwoofer for many of the reasons described above. However, power amplifiers capable of providing such power levels tend to create large amounts of heat which, in turn, requires large heat sinks, massive power reserve capacitors, and large transformers, all of which are large in size, heavy, and expensive. All of these factors are undesirable; and, all tend to reinforce the need for a relatively large cabinet.

Thus, as can be seen from the foregoing, because of the large power demands required by subwoofer systems and the large cost involved in providing large amounts of power amplification, prior art subwoofer apparatus have invariably required, and utilized, large cabinets which held drivers having large diameters and short strokes. Such an arrangement, as discussed above, allowed the subwoofer to move reasonable amounts of air without distortion. However, normal listening environments often do not have space for such a large cabinet. Therefore, there is a need for a subwoofer system capable of producing low frequency information at high listening volumes that is packaged in a small volume cabinet.

SUMMARY OF THE INVENTION

The present invention overcomes the foregoing problems and disadvantages inherent in the design, construction and operation of conventional prior art subwoofers by providing a subwoofer design that is characterized by: i) a relatively small volume sealed cabinet—e.g., a cabinet defining an enclosed space on the order of about 0.495 cubic feet in volume; or, substantially less than 1 cubic foot in volume in the exemplary apparatus illustrated (Stated differently, the present invention requires a cabinet which ranges from only about 1/15th to about 1/25th the size of the cabinets employed in conventional prior art subwoofers)—ii) a commutated voice coil arrangement employing two separate and distinct, relatively short, voice coils wherein only one coil needs to be driven by the audio signal amplifiers during any given time period, thereby, significantly increasing driver efficiency while substantially reducing the heat loss inherent in the voice coils; iii) having a relatively small, compact, power supply capable of delivering six volts over and above the voltage required by the amplifiers and which, therefore, results in dissipation of only 80 watts of power while delivering over 2,000 watts of power to the subwoofer. This is contrasted with prior art subwoofer amplifiers which must be capable of generating power levels ranging from 100 watts to 300 watts while dissipating 300 watts to 900 watts; and iv), having a relatively small diameter cone—e.g., only about 7" in the exemplary apparatus—as contrasted with prior art cones having cone diameters often ranging from at least 10" to about 13", yet wherein the driver's peak-to-peak stroke is approximately 2.5" as contrasted with prior art drivers having peak-to-peak strokes ranging from only about 0.6" to about 0.8"—i.e., an arrangement wherein the stroke of the driver is from about 3 to about 4 times greater than achievable with conventional prior art subwoofer driver configurations.

As a result of the foregoing, a subwoofer embodying features of the present invention is characterized by its extremely small size, high efficiency, high power and high acoustically accurate sound levels, all without requiring large, heavy and costly heat sinks and storage capacitors.

It is a general aim of the present invention to provide a small, compact, fully contained subwoofer capable of generating high quality, low distortion, and low frequency signals at high listening volumes, yet which is packaged in an aesthetically pleasing small volume cabinet.

More specifically, it is an object of the invention to provide a subwoofer capable of generating acoustically accurate low frequency signals at high listening volumes packaged in a relatively small volume cabinet.

A related object of the invention is the provision of a subwoofer having a relatively small volume cabinet, yet which has power and sound characteristics at least equal to, if not substantially better than, conventional prior art subwoofers despite the fact that the subwoofer is only a fraction of the size, weight and cost of commercially available subwoofers. In achieving this objective, the subwoofer of the present invention is generally fully contained in a cabinet occupying a total volume of space significantly less than 1 cubic foot—e.g., approximately 0.495 cubic feet—rendering the subwoofer unobtrusive to the user and facilitating easy placement of one or more subwoofers in a listening room or in other living areas within a user's residence, office or like facility.

In one of its more detailed aspects, it is an object of the invention to provide a relatively low cost subwoofer apparatus capable of equaling or exceeding the performance characteristics of conventional large and more expensive subwoofers; and, which is compact, light weight, aesthetically attractive in appearance, and devoid of large heat sinks, storage capacitors, and the like.

A further objective of the present invention is to provide a subwoofer apparatus which, despite its small size employing a cabinet having a sealed volume of space substantially less than 1 cubic foot, is highly efficient and capable of moving or displacing large volumes of air—e.g., a volume of just under 200 cubic inches of air—in response to driver movement through a peak-to-peak stroke of up to 2.5".

DESCRIPTION OF THE DRAWINGS

These and other objects and advantages of the present invention will become more readily apparent upon reading the following Detailed Description and upon reference to the attached drawings, in which:

FIG. 17 is a schematic circuit drawing depicting an exemplary Low Pass Filter employed with the present invention;

FIG. 18 is a schematic circuit drawing depicting an exemplary Servo Device employed with the present invention;

Figure 1:
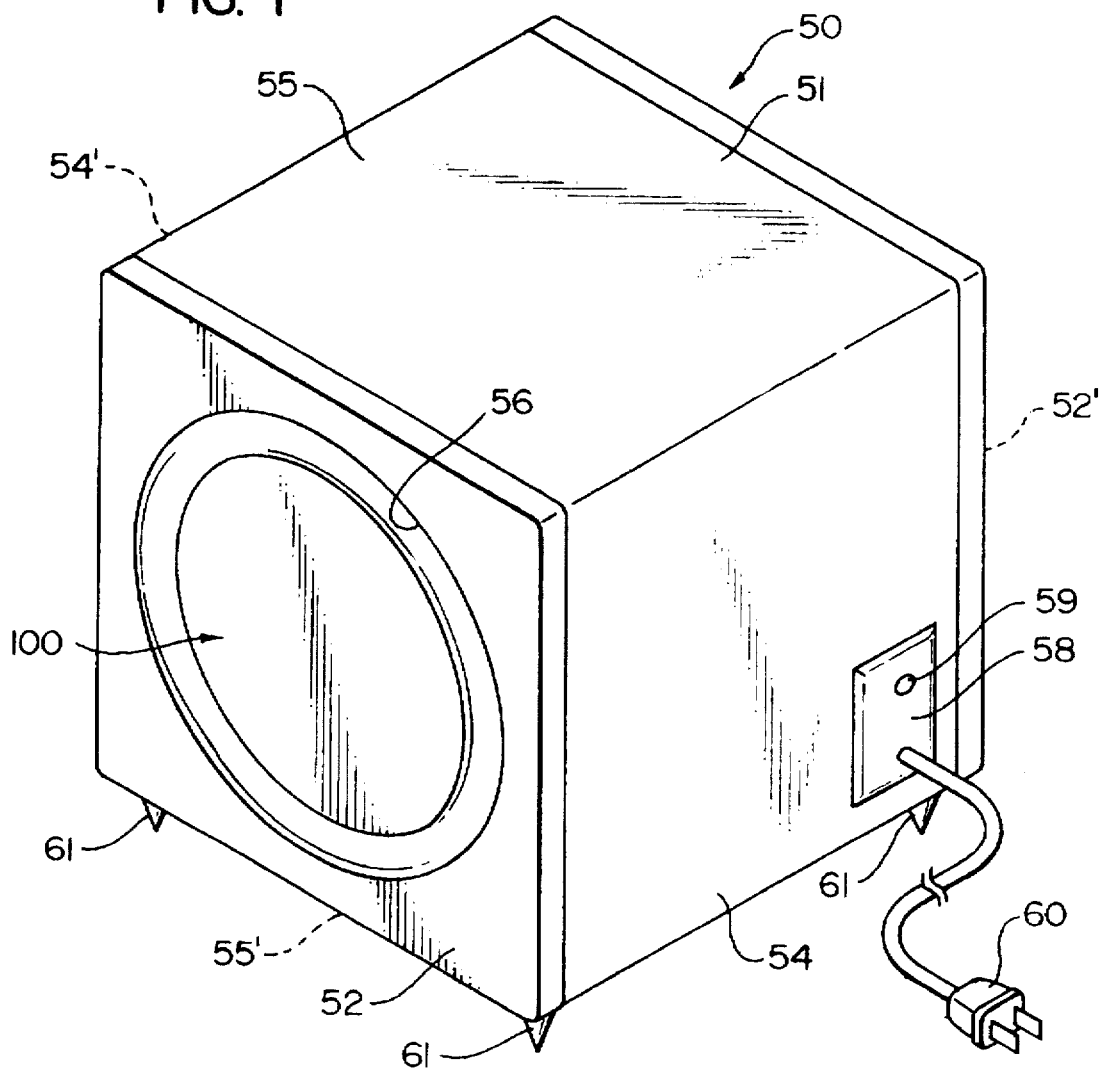
FIG. 1 is an isometric view depicting an exemplary subwoofer embodying features of the present invention.

While the invention is susceptible of various modifications and alternative forms, a specific embodiment thereof has been shown by way of example in the drawings and will herein be described in detail. It should be understood, however, that it is not intended to limit the invention to the particular form of the invention disclosed; but, on the contrary, the intention is to cover all modifications, structural equivalents, equivalent structures, and/or alternatives falling within the spirit and scope of the invention as expressed in the appended claims. Thus, in the appended claims, means-plus-function clauses and similar clauses are intended to cover: i) the structures described herein as performing a specific recited function; ii) structural equivalents thereof; and iii), equivalent structures thereto. For example, although a nail and a screw may not be deemed to be structural equivalents since a nail employs a cylindrical surface to secure wooden parts together while a screw employs a helical surface, in the art broadly pertaining to the fastening of wooden parts, a nail and a screw should be deemed to be equivalent structures since each perform the recited fastening function.

DETAILED DESCRIPTION

Turning now to the drawings, an exemplary embodiment of the present invention will now be described. Thus, referring first to FIG. 1, an exemplary subwoofer, generally indicated at 50, embodying features of the present invention has been depicted. As here shown, the subwoofer 50 includes a cabinet 51 which encloses two drivers, generally indicated at 100 (only one driver 100 is visible in FIG. 1; and, the details of the exemplary driver are more specifically shown in FIG. 2) which are each oriented in a PUSH/PULL configuration on opposite sides of the cabinet 51. That is, the visible driver 100 depicted in FIG. 1 is mounted in one wall of the cabinet 51 (here the front wall 52 of the cabinet) and fires in a first PUSH or PULL direction; while the second driver 100 (not visible in FIG. 1, but mounted in the opposite or rear wall 52' of the cabinet in the illustrative embodiment of the invention) simultaneously fires in the opposite PUSH or PULL direction.

In carrying out the invention, the cabinet 51 is a substantially cubic structure with front and rear walls 52 (52'), sidewalls 54 (54'), and top and bottom walls 55 (55'), all preferably constructed of a rigid, non-resonant, inert material such as MDF type particle board, wood, or the like. Each panel or wall can have a suitable finish applied thereto such that the subwoofer 50 can match the furnishings of the room where it will be installed. The drivers 100 may, if desired, be covered by an acoustically transparent material (not shown).

As indicated above, cabinet 51 includes six panels—viz., front and rear panels or walls 52 (52'), opposed side panels or sidewalls 54 (54'), and top and bottom panels or walls 55 (55')—all of which are substantially equal in size—for example, approximately 11"×11" defining a volume of enclosed space of substantially less than one (1) cubic foot (in the exemplary embodiment of the invention herein illustrated and described, the enclosed volume of space is only on the order of about 0.495 cubic feet; or, only about ⅕th to about ¹⁄₂₅th the size of conventional subwoofer cabinets). In the illustrative form of the invention depicted in FIG. 1, the front and rear panels or walls 52 (52') each have an opening 56 in which the drivers 100 are installed, although only the opening 56 in the front panel 52 is visible in FIG. 1. Further, one of the panels—here, the visible side panel or sidewall 54—has a terminal plate 58 including an audio signal input terminal 59 and an A.C. outlet plug 60 installed therein. The audio signal input terminal 59 can be connected to any suitable cable (not shown) which brings the audio signal to the subwoofer 50. The panels 52 (52'), 54 (54') and 55 (55') of the cabinet 51 are affixed to each other to form the cabinet using known techniques. The cabinet 51 is preferably sealed so that air can neither enter nor exit. Feet 61 may be placed on the bottom panel 52' of the cabinet 51 which raise the subwoofer 50 off of the floor (not shown). The feet 61 are, in the illustrative apparatus, generally spike-like in shape, and of sufficient strength to support the subwoofer 50.

Figure 2:
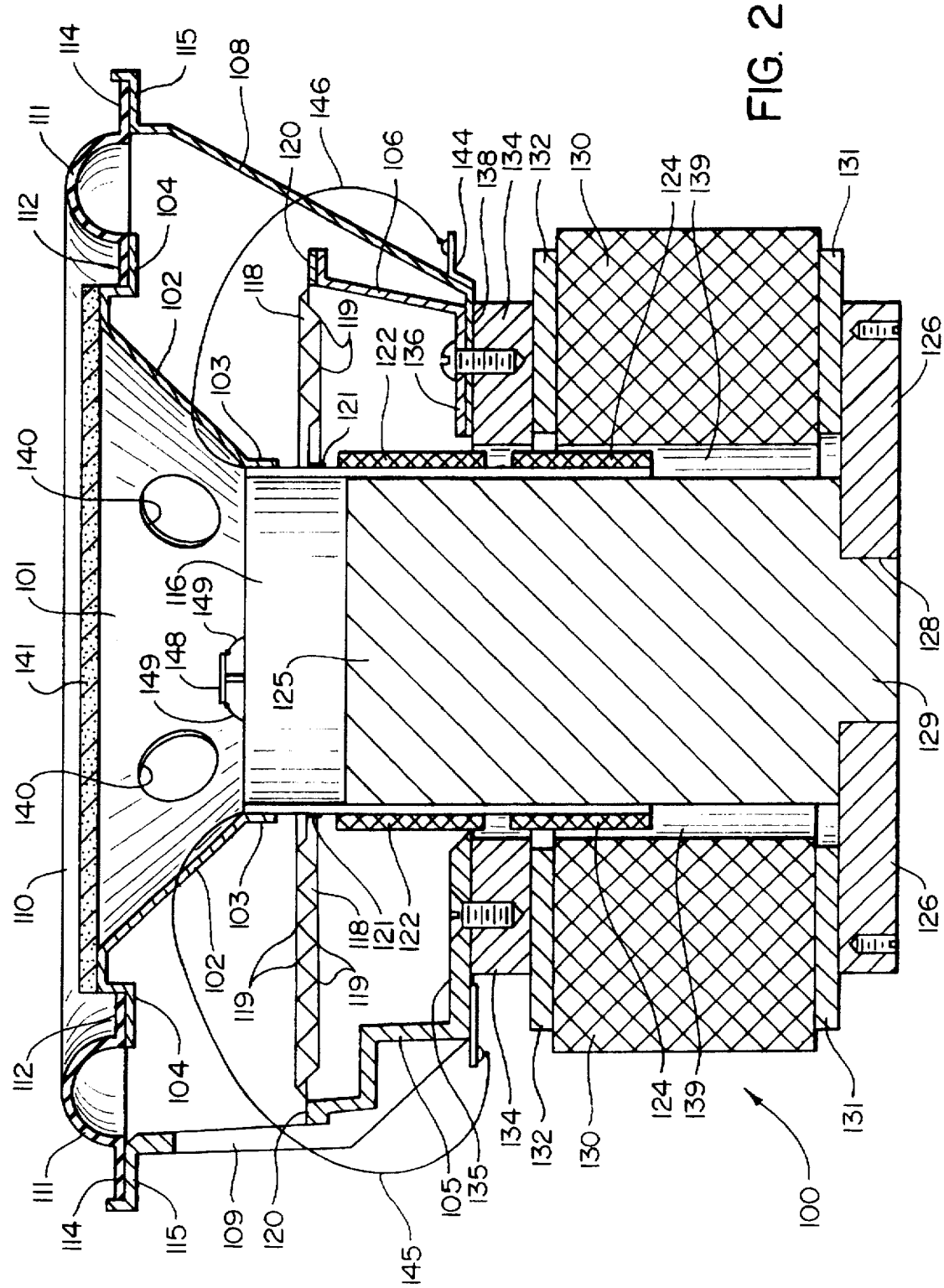
FIG. 2 is a vertical sectional view, here illustrating an exemplary driver used in the subwoofer of the present invention.

In accordance with one of the important aspects of the present invention, and as described in connection with FIG. 1, the exemplary subwoofer 50 employs two drivers 100— only one of which is visible in FIG. 1 as being mounted in the front panel 52. However, it will be understood by persons skilled in the art that the second driver 100 (not visible in FIG. 1) is mounted in the opposite cabinet panel, here the panel defining the rear wall 52'. For all practical purposes, and with but a single exception hereinafter noted, the two drivers 100 are identical in construction and mode of operation; and, therefore, a description of one driver 100 is equally applicable to the other. In the exemplary subwoofer 50 depicted in FIG. 1, and as best illustrated in FIG. 2, each driver 100 includes a driver cone 101 having a funnel-shaped main conical wall 102, an integral cylindrical mounting flange 103 at its apical end, and a radially extending stepped peripheral mounting flange 104 at its outward end. In the exemplary apparatus, the cone 101 preferably has a maximum diameter on the order of approximately 7" as contrasted with prior art driver cones typically having a maximum diameter on the order of at least 10", and often up to 13" or more.

In keeping with this aspect of the present invention, the driver cone 101 is mounted within the frame of the driver 100 consisting of frame members 105, 106, 108 and a plurality of peripherally spaced, axially extending, frame brackets, one of which is indicated at 109, with freedom for axial OUT/IN or PUSH/PULL movement relative to the stationary frame members 105, 106, 108, 109 from a null position as shown—i.e., the position occupied when no audio signal is present—by a stroke distance of approximately 1.25 inches (i.e., a peak-to-peak stroke from the maximum IN position to the maximum OUT position of approximately 2.5 inches.

To accomplish this, the driver cone 101 is supported on the frame members 105, 106, 108, 109 by an annular flexible suspension element 110, commonly referred to in the art as an "edgeroll" or the "surround". The exemplary suspension element or surround 110 is preferably formed of rubber or other suitable thick, heavy duty, flexible foamed material having resiliency characteristics similar to those of rubber; with the surround element 110 having a cross-sectional configuration comprising an inverted semi-circular body portion 111 with peripherally extending inner and outer flanges 112, 114 respectively. Here the inner flange 112 is seated on, and bonded to, the outer stepped mounting flange 104 on cone 101; while the outer flange 114 is similarly seated on, and bonded to, a laterally extending mounting flange 115 integral with the outermost extremities of frame members 108, 109. Any suitable bonding technique may be employed such, for example, as adhesive bonding using any conventional adhesive capable of bonding rubber or the like to cast aluminum or other suitable metal used to fabricate the frame members 108, 109. The inboard or lowermost mounting flange 103 (as viewed in FIG. 2) on the driver cone 101 is mounted to the outer surface of the upper extremity of a cylindrical or tubular element known as a voice coil former 116 preferably made of a high temperature plastic such as capton, again through any suitable bonding technique. A spring-type annular spider 118 formed of phenolic-impregnated-cloth or the like having concentric circular corrugations 119 is provided for completing the suspension system for the cone 101; with the outer peripheral edge 120 of the spider 118 being adhesively bonded to frame members 105, 106 and the inner peripheral edge 121 being bonded to the voice coil former 116. In the exemplary apparatus, the spider 118 acts to limit displacement of the cone 101 so that axial IN/OUT or PULL/PUSH cone motion is not exaggerated.

In order to fire the driver 100 in either a PUSH/OUT direction or a PULL/IN direction, and as best shown by reference to FIGS. 2 and 3 conjointly, the exemplary voice coil former 116 has a pair of separate and distinct, relatively short, axially spaced apart, voice coils 122, 124 wound thereabout and adapted to be energized in a manner described below. As here shown, the voice coil former 116 surrounds a solid rod-like pole 125 formed of magnetic material with the voice coil former 116 being axially moveable relative to, and concentrically about, the pole 125 from the null position shown in FIG. 2 in either an OUT/PUSH direction (i.e., upwardly as viewed in FIG. 2) or an IN/PULL direction (i.e., downwardly as viewed in FIG. 2), with the degree of permitted axial movement from the null position being approximately 1.25" in either direction so as to define a peak-to-peak stroke of approximately 2.5". Such large stroke movement is possible with the present invention because of the construction of the suspension system comprising the surround 110 and the spider 118, the shape and flexible resilient nature of which readily accommodate axial displacement from the null position shown in FIG. 2 by about 1.25 inches in either axial direction.

In further keeping with the invention, the exemplary driver 100 includes: i) an annular base plate 126 having an axially extending through bore 128 adapted to receive an axially extending reduced diameter portion 129 formed on pole 125; ii) an annular magnet 130; iii) an annular bottom plate 131 interposed between the magnet 130 and the base plate 126; iv) an annular top plate 132 mounted on top of the magnet 130; and v), an annular connecting plate 134 interposed between the top plate 132 and inwardly projecting radial flanges 135, 136, 138 formed on respective ones of frame members 105, 106, 108. In short, and as will be appreciated upon inspection of FIG. 2, the base plate 126, magnet 130, bottom and top plates 131, 132, connecting plate 134 and flanges 135, 136, 138 are all annular in configuration and arranged in vertically stacked coaxial relation surrounding the central pole 125. At the same time, the annular elements 130, 131, 132, 134, 135, 136 and 138 all have internal diameters which are, on average, approximately 0.4" greater than the external diameter of the coaxial pole 125, thus defining an annular gap 139 therebetween having a radial dimension of approximately 0.20", which gap is here referred to as the "magnetic gap". The arrangement is such that the magnetic gap is sufficiently wide as to permit the voice coil former 116, and the two commutated voice coils 122, 124 wound therebabout, to freely shift axially either inwardly or outwardly dependent upon which coil 122, 124 is energized at any given period of time.

In operation, and assuming no current is flowing in either voice coil 122, 124, then the drive cone 101 and the voice coil former 116 will remain in the null position shown in FIG. 2. However, when current flows in voice coil 122, a magnetic field is created which tends to pull the voice coil 122 and the voice coil former 116 about which it is wound, together with the drive cone 116 attached thereto, downwardly as viewed in FIG. 2, through a vertical stroke of approximately 1.25"; and, the flexible suspension defined by the surround 110 and spider 118 readily permits such downward or inward motion, here termed a PULL or IN motion, serving to compress the air within the sealed cabinet 51. If, on the other hand, coil 124 is energized by current flowing therethrough, the voice coil former 116, voice coils 122,124 and driver cone 101 are driven axially outward through a stroke of approximately 1.25" during a PUSH or OUT movement of the driver 100, so as to create a partial vacuum within the sealed cabinet 51. Consequently, the overall peak-to-peak stroke of the exemplary driver 100 is approximately 2.5".

Figure 3:
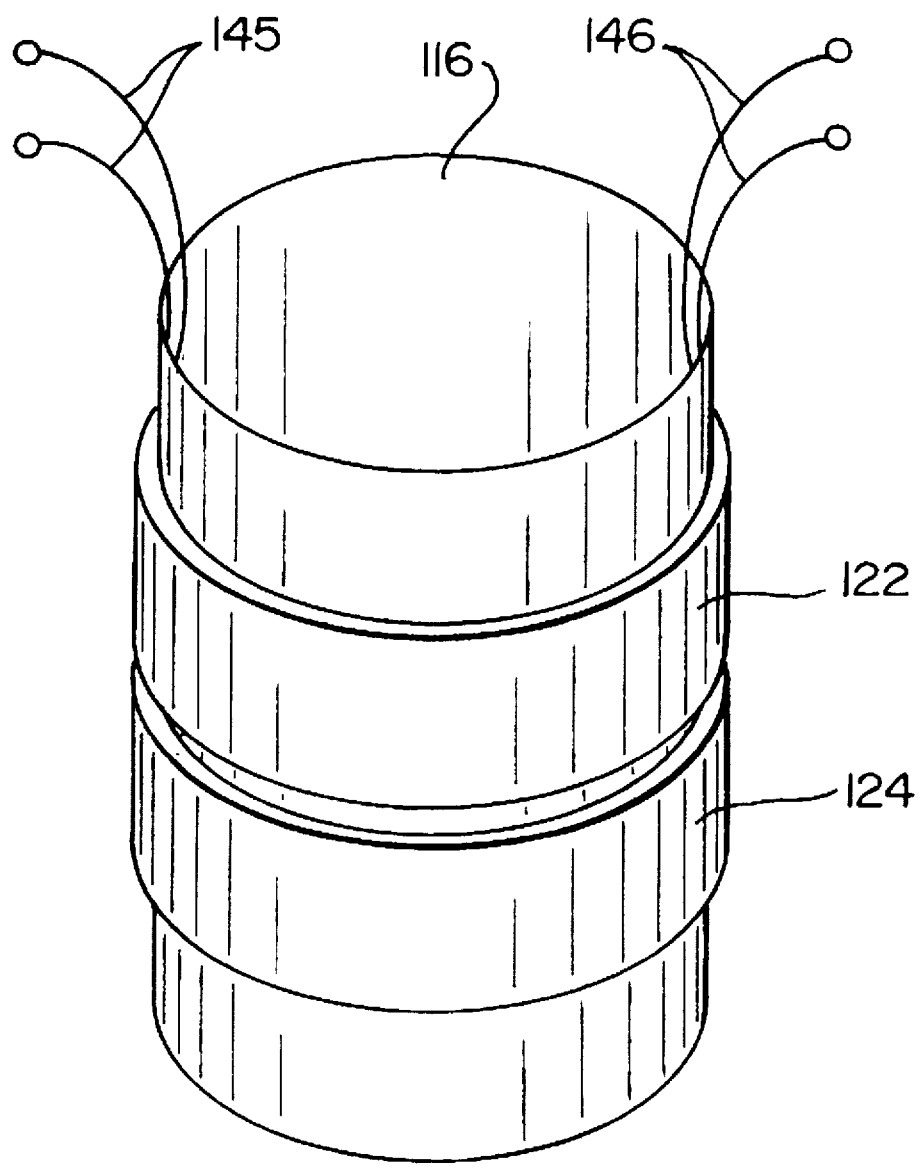
FIG. 3 is an isometric view of an illustrative commutated voice coil arrangement suitable for use with the present invention.

With reference to FIGS. 2 and 3 conjointly, it has been found that employing two separate and distinct voice coils 122, 124—here defining a composite commutating voice coil—provides distinct advantages over the prior art because it enables the efficiency of the driver 100 to increase dramatically. By way of comparison, it will be appreciated by persons skilled in the art that in prior art drivers, the single voice coil receives all of the audio signal. Thus, a large amount of the power provided by the amplifier is lost in the voice coil due to heating of the voice coil. Further, the longer the voice coil is made, the greater the amount of amplifier loss due to voice coil heating. Thus, the inefficiencies of using a long voice coil is another factor limiting the allowable stroke of the driver cone.

The present invention solves these problems by utilizing two separate and distinct voice coils 122, 124. By using two separate voice coils 122, 124, only one needs to be amplifier-driven during any given time period to move the driver cone 101. This greatly reduces the amount of voice coil heating which, in turn, greatly increases driver efficiency.

To facilitate movement of the driver cone 101, the cone is preferably of perforate form having a plurality of holes or openings 140 formed in conical wall 102, thus, serving to permit air movement through the openings 140 during axial movement of the driver cone in either direction. The opening at the uppermost end of the funnel-shaped cone 101 as viewed in FIG. 2 is preferably closed by a suitable diaphragm 141 formed of material sufficiently strong as to prevent deformation due to pressure differentials across the diaphragm 141 as the driver 100 is fired in either axial direction. For example, it has been found that a diaphragm formed of a foamed aluminum sheet approximately 0.1875" in thickness provides excellent results. In this exemplary arrangement, the peripheral edge of the diaphragm 141 is seated on, and bonded to, the stepped mounting flange 104 formed at the outermost large diameter extremity of the cone 101. Tie points 142, 144 are fixedly secured to respective ones of frame flange 135 and frame element 108, serving as points for connection of respective ones of energizing leads or electrical conductors 145, 146 which are provided for delivering current to respective ones of the voice coils 122, 124 in the manner hereinbelow described.

Figure 4:
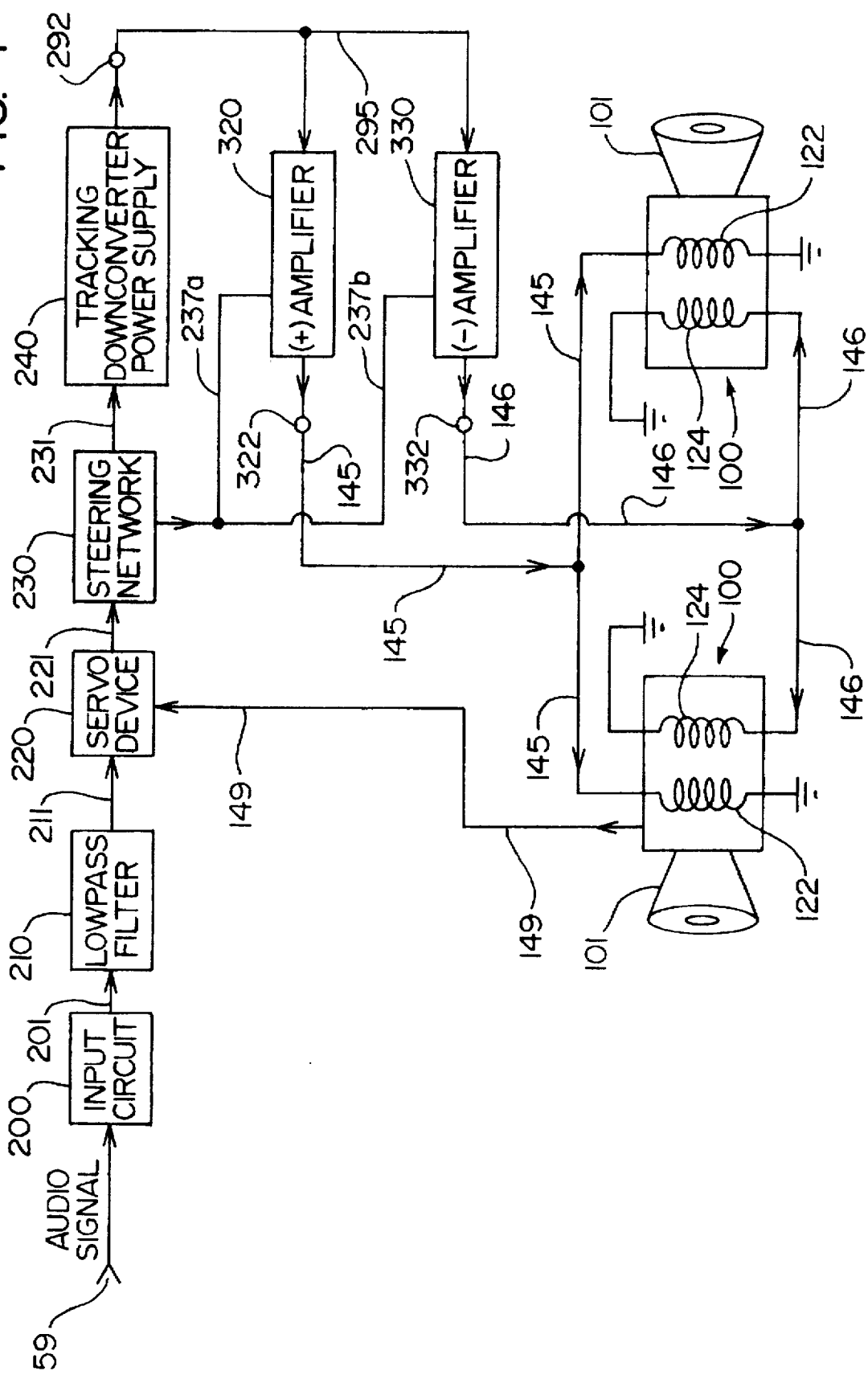
FIG. 4 is a block-and-line diagrammatic drawing, here illustrating the electrical architecture employed with the present invention.
Figure 16:
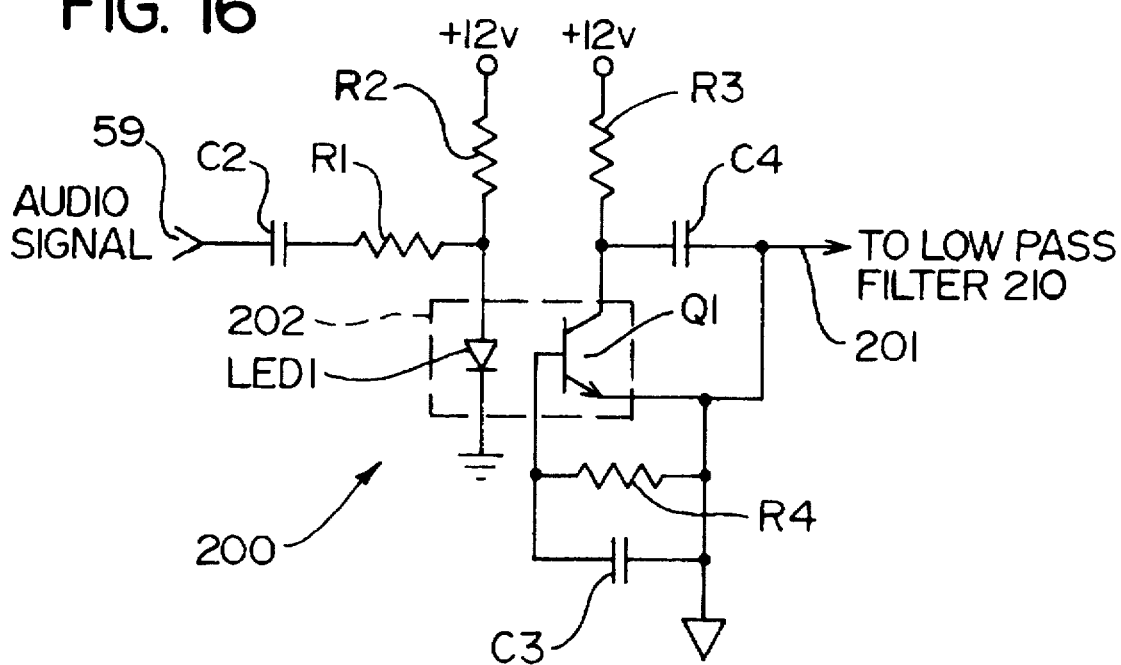
FIG. 16 is a schematic circuit drawing depicting an exemplary Input Circuit for the subwoofer of the present invention.

Directing attention now to FIG. 4, an illustrative, but exemplary, overall circuit architecture controlling operation of the drivers 100 has been illustrated in highly diagrammatic block-and-line form. The specific circuit details for each of the blocks shown will be described in greater detail below in connection with FIGS. 16 through 22. Thus, as shown in FIG. 4, an audio signal from a signal source (not shown) is presented at an Input Circuit 200 of the subwoofer 50. More specifically, the audio signal is presented at the input terminal 59 (FIGS. 1 and 4) of the subwoofer 50. Input Circuit 200 serves to isolate the electronics within the subwoofer 50 from the environment outside the cabinet 51. Input Circuit 200, an exemplary embodiment of which is shown in FIG. 16, will be described in greater detail below.

Input Circuit 200 outputs a signal via line 201 which is presented to a Low Pass Filter 210. Low Pass Filter 210 filters out those frequencies of the audio signal which the subwoofer 50 will not be reproducing. This higher frequency information will be reproduced by the sound system's main speakers (not shown). An exemplary embodiment of the Low Pass Filter 210 is shown in FIG. 17 and will be described below.

The signal which is output from the Low Pass Filter 210 is input via line 211 to a Servo Device 220. Servo Device 220 receives: i) the audio signal from the Low Pass Filter 210 on line 211; and ii), a feedback signal from an accelerometer 148 installed in one only of the two drivers 100—e.g., the driver 100 depicted in FIG. 2—which feedback signal is input on line 139. The accelerometer 148 is mounted on the voice coil former 116 in the driver 100 depicted in FIG. 2; and, is used to sense the motion of the driver. If the driver's motion is non-linear—i.e., distorted—the signal output by the accelerometer 148 will be a replica or exact analog of that distortion. For example, if the audio signal input to the subwoofer 50 is undistorted, and the driver 100 is moving in a distorted fashion, the output of the accelerometer 148 will also be distorted and fed back to the Servo Device 220 where it is combined with the original input signal. The original input signal is then modified in an inverted fashion with respect to the distortion sensed; and, the result is that the driver 100 receives a non-linear drive signal in such a way that the driver's motion is linear and non-distorted. An exemplary embodiment of the Servo Device 220 is shown in FIG. 18 and will be described below.

The signal which is output from the Servo Device 220 via line 221 is input to a Steering Network 230. Steering Network 230 is utilized so as to insure that one of the voice coils 122, 124—e.g., here, voice coil 122—always receives the positive portion of the audio signal; while the other voice coil—e.g., voice coil 124—always receives the negative portion of the audio signal. More specifically, those skilled in the art will appreciate that audio signals contain both positive voltage swings and negative voltage swings. Amplifiers, unless they are biased in Class A operation, cannot reproduce both the positive and negative information. Various solutions to this problem have been developed, such as Class B biasing.

Figure 19:
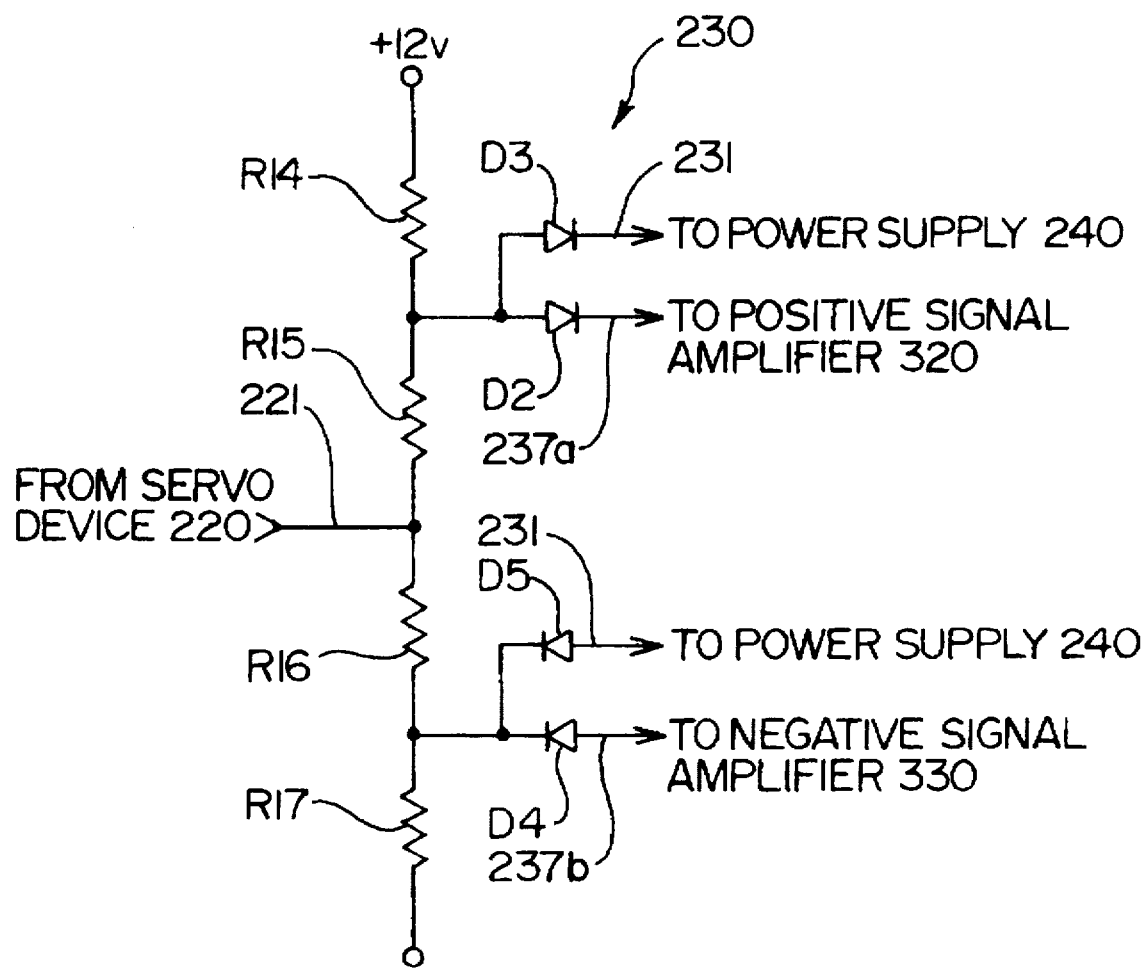
FIG. 19 is a schematic circuit drawing depicting an exemplary Steering Network for outputting signals to the Tracking Downconverter Power Supply of the present invention.

The present invention solves this problem by "steering" the output of the Tracking Downconverter Power Supply 240 (which will be discussed below) to one of two amplifiers which respectively amplify either the positive or the negative audio signal. The Steering Network 230, via its connections to the Power Supply 240, a Positive (+) Signal Amplifier 320, and a Negative(−) Signal Amplifier 330, operates to ensure that the positive and negative audio signals are amplified and presented to respective ones of the voice coils 122, 124. Specifically, the audio signal passes through the Steering Network 230 to the Power Supply 240. However, the Steering Network 230 contains circuitry which, when the audio signal has a positive voltage swing, enables the Positive Signal Amplifier 320; and, when the audio signal has a negative voltage swing, enables the Negative Signal Amplifier 330. An exemplary embodiment of the Steering Network 230 is shown in FIG. 19 and will be described below.

As previously discussed, the output of the Steering Network 230 (FIG. 4) is conveyed via line 231 to the Tracking Downconverter Power Supply 240. In keeping with the invention, and as will be discussed below in greater detail, the Tracking Downconverter Power Supply 240 is capable of supplying large amounts of current and, therefore, large amounts of power to both the Positive Signal Amplifier 320 and the Negative Signal Amplifier 330. The ability of the Power Supply 240 to deliver large amounts of power provides many advantages. For example, it allows the cabinet 51 (FIG. 1) to be extremely small because large amounts of power can be provided to the drivers 100 to overcome the pressures created by small cabinet volumes. Further, because the pressures created by a small cabinet volume can be overcome, it is possible to utilize drivers 100 with much longer strokes than used in the prior art. Thus, in the illustrative embodiment of the present invention, the cabinet 51 (FIG. 1) can have sides having a length of approximately 11", drivers 100 having a diameter of approximately 7", and a peak-to-peak stroke of approximately 2.5". Such a driver 100 could not be used by prior art subwoofers because the power necessitated by such a combination could not be provided. Utilizing two separate voice coils 122, 124 also contributes to the small size of the subwoofer 50 because it greatly increases the efficiency of the subwoofer. The details of an exemplary embodiment of the Tracking Downconverter Power Supply 240 will be discussed below.

Figure 21:
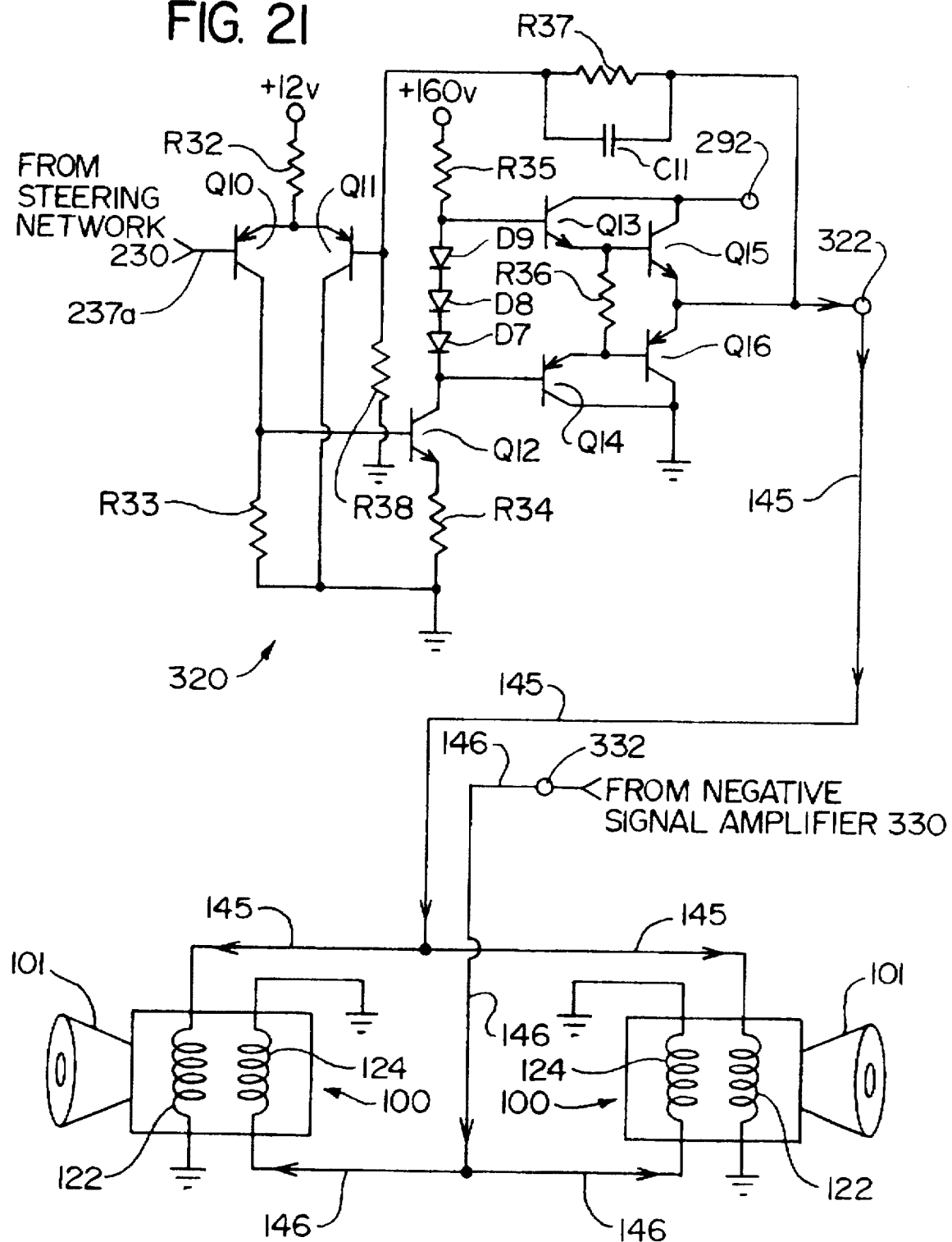
FIG. 21 is a schematic circuit diagram depicting an exemplary Positive Signal (+)Amplifier employed with the present invention; and, FIG. 22 is a schematic circuit diagram depicting an exemplary Negative Signal (−) Amplifier employed with the present invention.
Figure 22:
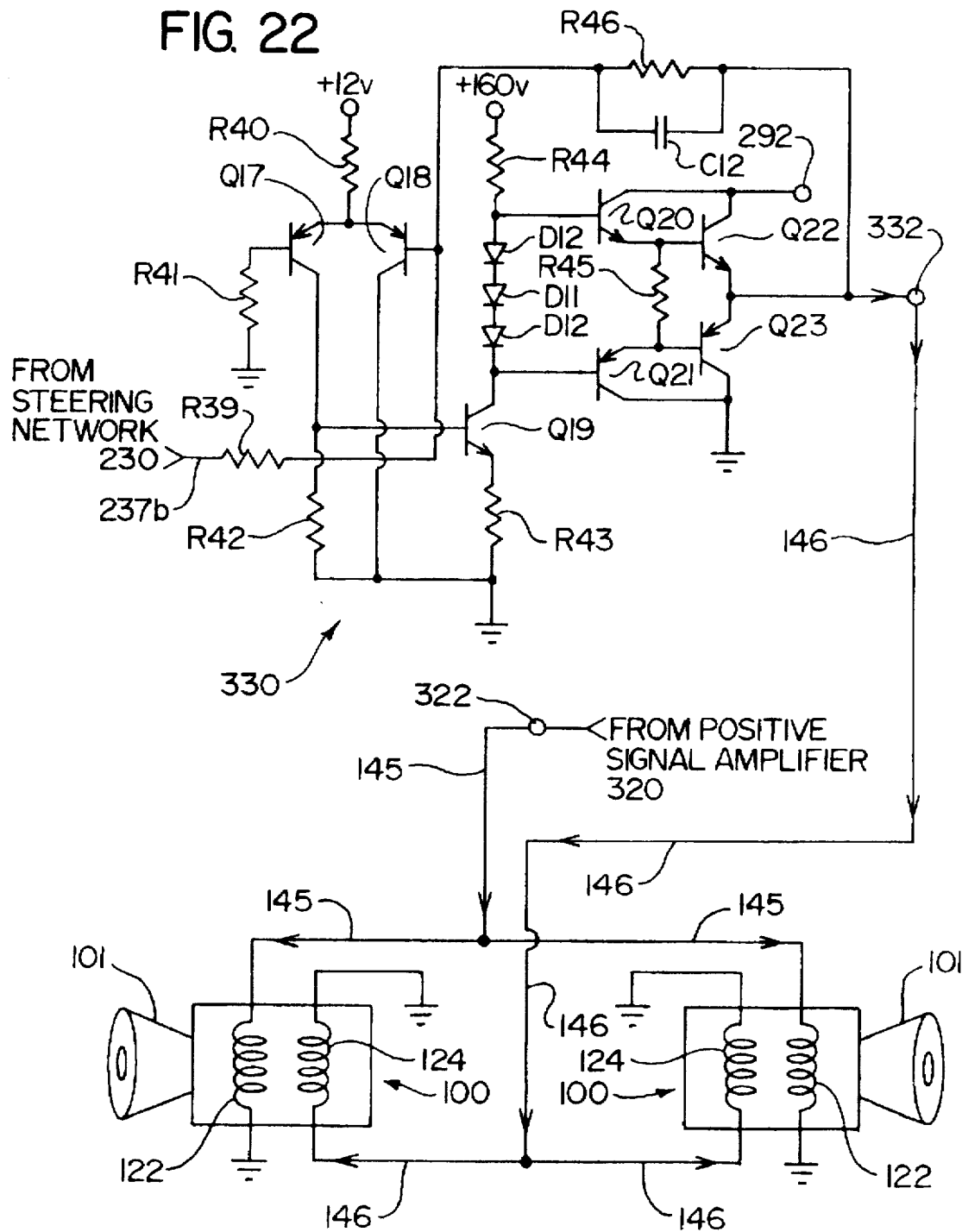

As will be noted, the output of the exemplary Power Supply 240 will always be negative—i.e., the positive-going audio signal will be inverted such that it is negative. Thus, the output of the Power Supply 240 is supplied to both a Positive Signal Amplifier 320 and a Negative Signal Amplifier 330. When the Power Supply 240 outputs a signal that should be positive, the Steering Network 230 ensures that the signal is amplified by the Positive Signal Amplifier 320. When the Power Supply 240 outputs a signal that should be negative (it already is negative because of the characteristics of the Power Supply 240), the Steering Network 230 ensures that the signal is amplified by the Negative Signal Amplifier 330. An exemplary embodiment of a Positive Signal Amplifier 320 is shown in FIG. 21; and, an exemplary embodiment of a Negative Signal Amplifier 330 is shown in FIG. 22. Both will be described below.

As discussed above, the illustrative embodiment of the present invention utilizes two separate and distinct voice coils 122, 124. The output of the Positive Signal Amplifier 320 is connected to the voice coils 122 of both drivers 100 via line 145 (FIGS. 1 and 4); while the output of the Negative Signal Amplifier 330 is connected to the voice coils 124 of both drivers 100 via line 146. Thus, whenever an audio signal is present at input terminal 59 (FIGS. 1 and 4), that audio signal will be amplified with the positive-going amplified signal or the negative-going amplified signal, as the case may be, being directed to the appropriate voice coil 122, 124 in each of the drivers 100, thereby producing axial movement of the driver cone 101. Since the exemplary form of the present invention employs two drivers 100, the connections from the Positive Signal Amplifier 320 and Negative Signal Amplifier 330 are made in parallel circuit configuration.

Figure 5:
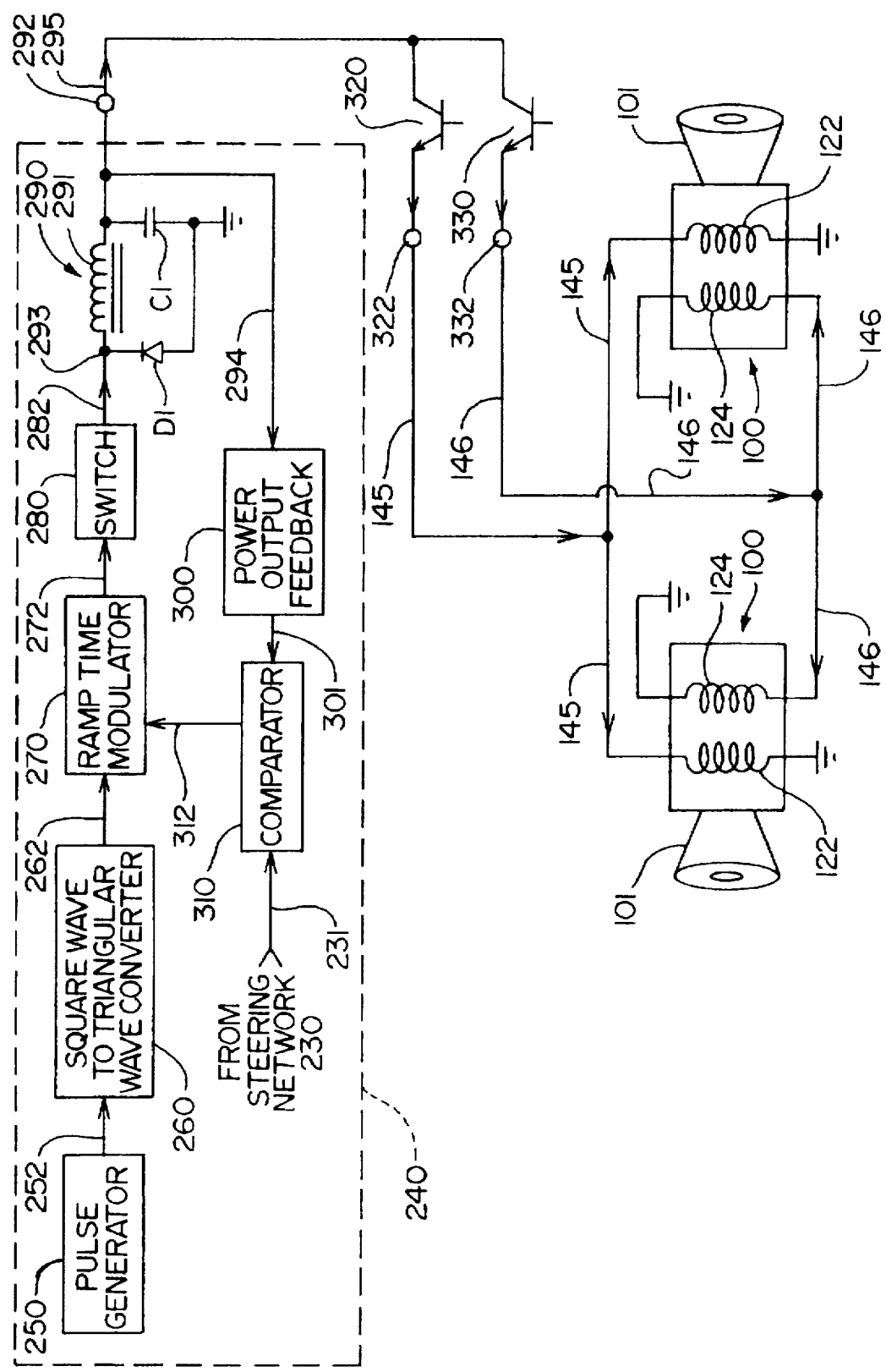
FIG. 5 is a block-and-line diagrammatic drawing, here depicting an exemplary Tracking Downconverter Power Supply employed in the subwoofer depicted in FIGS. 1 and 4.

Turning now to FIG. 5, an exemplary Tracking Downconverter Power Supply 240 suitable for use with the present invention has been illustrated. A power supply similar to that utilized in the exemplary embodiment of the present invention is disclosed in U.S. Pat. No. 4,218,660, issued Aug. 19, 1980 to Robert W. Carver; and, the disclosure contained in the specification and drawings of the aforesaid U.S. Pat. No. 4,128,660 is hereby incorporated by reference. The Power Supply 240 of the present invention regulates the amount of current delivered to the voice coils 122, 124 of the subwoofer 50 (FIG. 1) by tracking the audio signal to be amplified and comparing the magnitude of that signal to the signal actually being amplified. The exemplary Power Supply 240 includes: i) a Pulse Generator 250; ii) a Square Wave To Triangular Wave Converter 260; iii) a Ramp Time Modulator 270; iv) a Switch 280; v) a Power Output Section, generally indicated at 290, including an inductor 291; vi) a Power Output Feedback circuit 300; and vii), a Comparator 310 which receives input signals from the Steering Network 230 (FIG. 4) and the Power Output Feedback circuit 300 (FIG. 5), compares the input signals, and generates a control signal which is transmitted to the Ramp Time Modulator 270.

The power delivered to the drivers 100 by the inductor 291 in the Power Output Section 290 is controlled by controlling the time within which the Switch 280 is open for each current pulse. This is accomplished by tracking the audio signals which are to be amplified by the Positive Signal Amplifier 320 and the Negative Signal Amplifier 330; and, comparing these tracked signals to the voltage imposed across respective ones of the Positive Signal Amplifier 320 and the Negative Signal Amplifier 330. This produces a control signal which controls the duration of each current pulse delivered to the inductor 291. In other words, on the assumption that the Switch 280 is being opened and closed at a frequency of 100 Kilohertz, the duration of each time period would be 10 microseconds. During those time periods where the power requirements of the Positive Signal Amplifier 320 and the Negative Signal Amplifier 330 are high, then during each 10 microsecond time period, the Switch 280 will be open for a relatively large fraction of that time—e.g., for about 5 to about 7 microseconds. On the other hand, when power requirements of the Positive Signal Amplifier 320 and Negative Signal Amplifier 330 are relatively low, the Switch 280 will be open in each time period for a much shorter duration.

Figure 6:
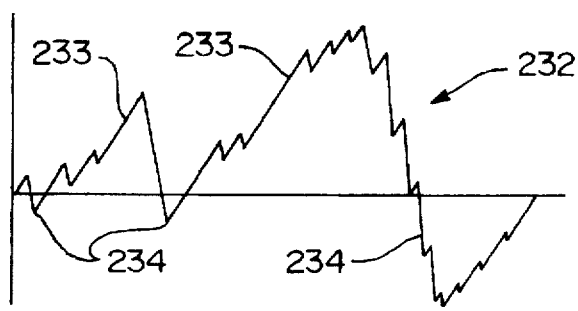
FIG. 6 is a graphic representation of a portion of a typical audio signal which the apparatus of the present invention is intended to amplify.
Figure 7:
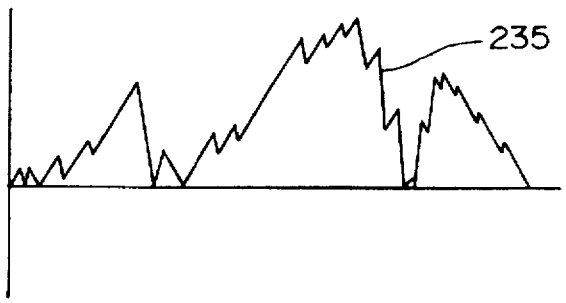
FIG. 7 is a graphic representation here depicting the audio signal as output from the Steering Network wherein the negative portions of the audio signal have been inverted.

As discussed above, the audio signal containing the low frequency information which is to be reproduced by the subwoofer 50 ultimately enters the Steering Network 230 (shown in FIG. 4). A portion of such an audio signal is generally indicted in FIG. 6 at 232. Note that the audio signal has both positive and negative portions 233, 234 respectively, with the positive portions 233 being represented as being above the abscissa in FIG. 6 and the negative portions 234 being represented below the abscissa. The Steering Network 230 produces an output where the negative portions 234 of the audio signal become positive, while maintaining these negative portions at the same magnitude relative to a zero line. The output of the Steering Network 230 is represented at 235 in FIG. 7, where it can be seen that the negative portions 234 of the signal of FIG. 6 have simply been inverted.

The output of the Steering Network 230 is then directed to the Comparator 310 via line 231 (FIG. 5). The Power Output Feedback circuit 300, which is responsive to the voltage impressed across the power input terminals of the Positive Signal Amplifier 320 and the Negative Signal Amplifier 330, transmits a voltage generally proportional to the voltage at the power input terminals of the Positive and Negative Signal Amplifiers 320, 330 as a second input to the Comparator 310 via line 301. The Comparator 310 then "compares" the signal input from the Steering Network 230 and the signal input from the Power Output Feedback circuit 300 to produce a control signal generally proportional to the difference between the two inputs.

Figure 8:
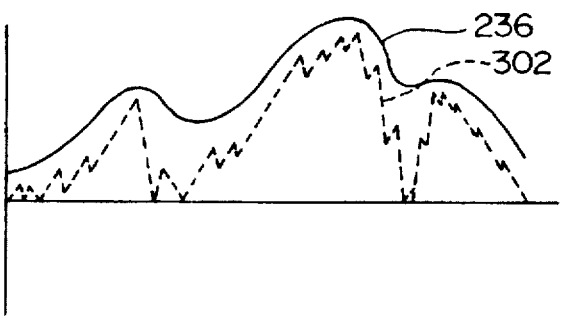
FIG. 8 is a graphic representation here depicting the inverted audio signal shown in FIG. 7 in broken lines and the voltage signal input to the Comparator from the Steering Network which is here approximately represented in solid line form.
Figure 9:
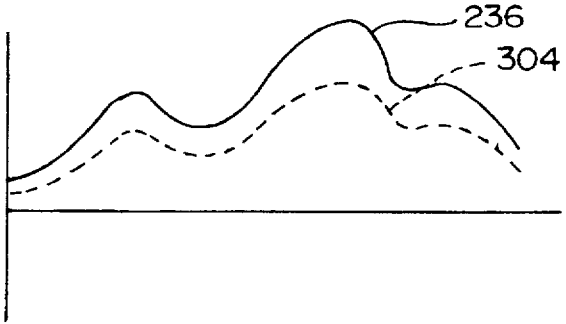
FIG. 9 is a graphic representation here illustrating the two signals input to the Comparator forming part of the Tracking Downconverter Power Supply with the voltage signal input from the Steering Network being depicted in solid line form and the voltage signal input from the Power Output Feedback being depicted in broken lines.

Referring next to FIG. 8, it will be observed that the two input signals on lines 231, 301 to the Comparator 310, have been diagrammatically depicted at 236—i.e., a solid line representing the signal input on line 231 from the Steering Network 330—and at 302—i.e., a broken line representing the signal input on line 301 from the Power Output Feedback circuit 300. It will further be noted upon comparison of FIGS. 8 and 9 that there is a relationship between: i) the magnitude of the signal 236 from the Steering Network 230; and ii), the difference between the signal 236 from the Steering Network 230 and the signal 302 from the Power Output Feedback circuit 300 in that the increment of increase and the difference between the two signals 236 and 302 increase generally proportionally to the magnitude of the signal 236 from the Steering Network 230 as represented by the broken line 304 in FIG. 9. For purposes of illustration, this difference has been exaggerated somewhat in FIG. 9 from what the actual values may be. The control signal 311 which is the output of the Comparator 310 on line 312, has been diagrammatically illustrated in FIG. 10. It can be seen that this control signal 311 generally corresponds to the increment of increase or decrease in the difference between the two signals illustrated in FIGS. 8 and 9. Thus, control signal 311 is used to control the duration of the regularly timed current pulses in the inductor 291.

Figure 11:
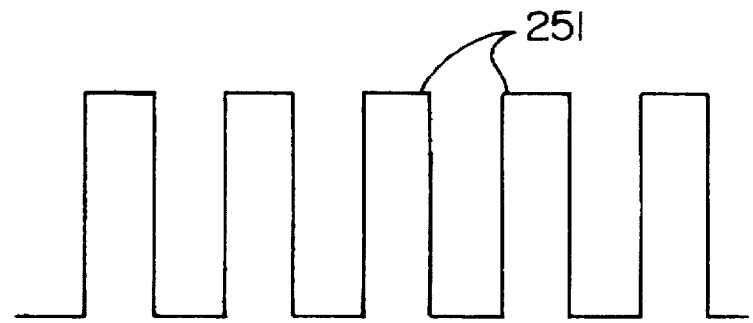
FIG. 11 is a graphic representation of the voltage pulses generated by the Pulse Generator forming part of the Tracking Downconverter Power Supply.

In keeping with the broad objectives of the present invention, the Pulse Generator 250 in the Tracking Downconverter Power Supply 240 illustrated in FIG. 1 functions to generate a pulsed wave of a constant voltage as indicated at 251 in FIG. 11—i.e., a wave where the gaps between the pulses are of approximately the same duration as the pulses themselves. The pulses are, in turn, of the same frequency as the desired current pulses for the inductor 291. In the particular embodiment described herein, where the frequency of the current pulses in the inductor 291 are 100 Kilohertz, the output from the Pulse Generator 250 on line 252 would be of the same frequency.

The output pulse wave 251 (FIG. 11) from the Pulse Generator 250 (FIG. 5) is directed via line 252 to the Square Wave To Triangular Wave Converter 260. This serves to convert the wave form 251 of FIG. 11 to a wave form 261 (FIG. 12) where each pulse has the configuration of an isosceles triangle and where, during the duration of each pulse, the voltage climbs at a substantially constant rate to a peak at the middle of the pulse, and the declines at a constant rate through the latter half of the pulse.

Figure 12:
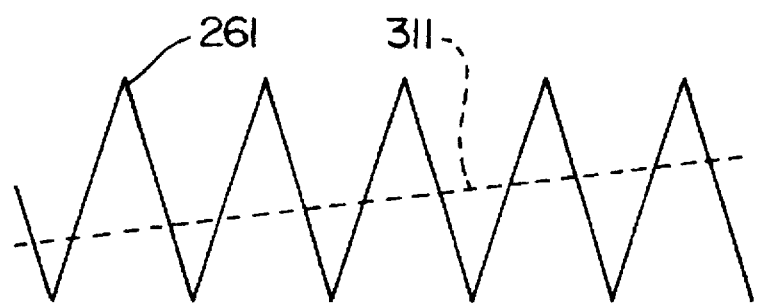
FIG. 12 is a graphic representation of the wave transmitted to the Ramp Time Modulator and the manner in which the signal voltage control signal from the Comparator is imposed thereon.

The output wave form 261 from the Square Wave To Triangular Wave Converter 260 is then transmitted via line 262 to the Ramp Time Modulator 270 which, as previously described, also receives the control signal 311 from the Comparator 300 via line 312. This is illustrated in FIG. 12 by representing a portion of the control signal 311 from the Comparator 310 in broken lines superimposed over the triangular wave form 261 output from the Square Wave To Triangular Wave Converter 260. As shown in FIG. 12, that portion of the control signal 311 is increasing in magnitude. For purposes of illustration, the slope representing the rate of increase of the control signal 311 may be exaggerated to some extent.

Figure 13:
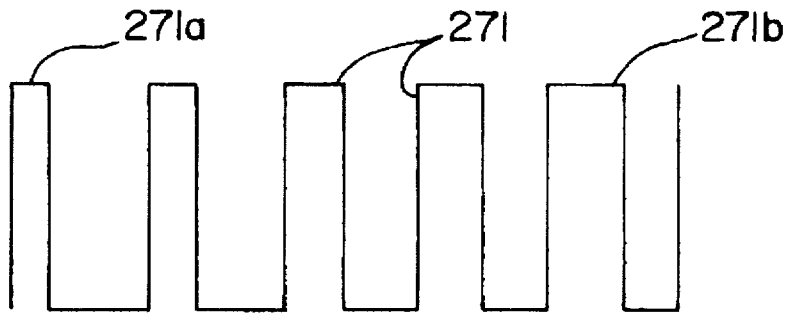
FIG. 13 is a graphic representation of the pulses output from the Ramp Time Modulator resulting from the imposed Comparator control signal as reflected in FIG. 12.

The output of the Ramp Time Modulator 270 is illustrated in FIG. 13 as a constant voltage pulse signal 271 having the same frequency as that of the Pulse Generator 250. The duration of each pulse is directly proportional to the duration of the bottom portion of the triangular wave form 261 depicted in FIG. 12. Thus, it can be appreciated by comparing the duration of the pulses of FIG. 13 with the slope of the control signal 311 as indicated in the broken lines of FIG. 12, that the duration of the pulses shown in FIG. 13 are proportional to the magnitude of the control signal 311 as shown in FIG. 12.

Figure 14:
FIG. 14 is a graphic representation of an illustrative series of current pulses transmitted from the Tracking Downconverter Power Supply to the Negative and Positive Signal Amplifiers associated with the voice coils in the driver.

The voltage pulse signal 271 depicted in FIG. 13 is output on line 272 from the Ramp Time Modulator 270; and, is used to open and close the Switch 280 in such a manner that the Switch 280 is open during the duration of each of the pulses depicted in FIG. 13. The manner in which the voltage pulses 271 from the Ramp Time Modulator 270 act on the Switch 280 to cause current pulses 281 in the inductor 291 is illustrated in FIG. 14. Thus, it can be seen that a voltage pulse of relatively short duration as indicated at 271a in FIG. 13 produces a corresponding current pulse 281a (FIG. 14) of relatively small amplitude, since the current has such a very short time period to build up or "ramp up". It can be seen in FIG. 14 that as the voltage pulses 271 of FIG. 13 increase in duration, the amplitude of the current pulses 281 output on line 282 from the Switch 280 and routed to the inductor 291 increase correspondingly. Thus, voltage pulse 271b, which has the longest duration of the voltage pulses 271 shown in FIG. 13, produces a current pulse 281b of the largest amplitude of those shown in FIG. 14.

Having the foregoing in mind, a brief overview of the operation of the Power Supply 240 will be set forth hereinbelow in terms of the block-and-line diagrams depicted in FIGS. 4 and 5. As previously indicated, the subwoofer 50 is provided with electrical power from any suitable A.C. source via A.C. outlet plug 60 (FIG. 1). In the United States, the A.C. source will comprise an alternating current source of 110 to 120 volts and 60 cycles per second. Other countries have somewhat different systems. However, the concepts discussed here can be adapted by one of ordinary skill in the art to electrical systems of other countries without departing from the scope of the present invention as expressed in the appended claims. The current from the A.C. source is rectified by a conventional rectifier (not shown) to convert it to direct current.

Referring to FIG. 5, it will be noted that the current pulses—e.g., pulses 281 depicted in FIG. 14—output from Switch 280 via line 282 are coupled at node 293 to inductor 291 and to diode D1 having its positive terminal connected to ground. Diode D1 completes the circuit path so that current may continue to flow into the load during OFF time periods of the Switch 280.

The arrangement is such that when an audio signal is presented at the input terminal 59 (FIGS. 1 and 4) of the subwoofer 50 for audible reproduction, it is presented to the Input Circuit 200; and, is then passed via line 201 to and through the Low Pass Filter 210 to extract the low frequency information that will be audibly reproduced. The low frequency signal is then servoed by the feedback signal from the accelerometer 148 (FIGS. 2 and 4) associated with one of the two drivers 100—such feedback signal being conveyed from the driver 100 to the Servo Device 220 via line 149 as shown in FIG. 4. Thereafter, the low frequency audio signal which has been servoed is presented via line 221 to the Steering Network 230 which performs several functions. For example, and as discussed above, the Steering Network 230 produces a signal output in the form of current pulses 281 (FIG. 14) wherein the negative portions of the audio signal become positive, and where the now positive (but formerly negative) portions of the audio signal retain the same absolute magnitude relative to a zero line as they did when they were negative relative to the zero line. For an example of this, see FIGS. 6, 7 and 11–14 and the above description relating thereto.

In keeping with this aspect of the present invention, the Steering Network 230 ensures that the positive-going and negative-going audio signals are amplified at the proper time. Thus, when the subwoofer 50 receives an audio signal to reproduce, the Steering Network 230 transmits an enabling signal to the Positive Signal Amplifier 320 via line 237a (FIG. 4) for positive swings of the audio signal; and, an enabling signal to the Negative Signal Amplifier 330 via line 237b for negative swings of the audio signal. The Steering Network 230 also sends the audio signal to the Tracking Downconverter Power Supply 240 via line 231 in the manner previously described above with reference to FIGS. 4 and 7.

Since upon initial start up there is no voltage generated at the output 292 of the Power Output Section 290 (FIG. 5), the feedback signal provided by the Power Output Feedback circuit 300 is zero or substantially zero. Accordingly, at start up the Comparator 310 generates a rather strong output signal 311 (FIG. 10) which is transmitted via line 312 (FIG. 5) to the Ramp Time Modulator 270. The Ramp Time Modulator 270, in turn, transmits current pulses 281 (FIG. 14) of the desired frequency to the electronic Switch 280, with these current pulses being of a maximum duration. In other words, the Switch 280 continues to turn ON and OFF at the same frequency; but, the duration of the ON periods is at a maximum. Accordingly, the current pulses 281 (FIG. 14) passing through the inductor 291 ramp up to a maximum amperage; and, therefore, deliver full power to the output terminal 292 on output line 295. Within a very short period of time (i.e., about 200 microseconds), the current pulses 281 transmitted to the Positive Signal Amplifier 320 and the Negative Signal Amplifier 330, respectively, build up to their proper operating level.

At this time, the Power Output Feedback circuit 300 transmits to the Comparator 310 an output signal related to the voltage level at the output terminal 292 of Power Output Section 290. Thereafter, the Comparator 310 continues to provide the Ramp Time Modulator 270 with a control signal 311 (FIG. 10) related to the power requirements of either the Positive Signal Amplifier 320 or the Negative Signal Amplifier 330 indicating that the amplitude of the audio signal is increasing; and, consequently, there is a greater disparity between this audio related signal and the signal exiting from the Power Output Feedback circuit 300, causing the strength of the control signal 311 being transmitted to the Ramp Time Modulator 270 to increase in magnitude. This, in turn, causes the current pulses 281 (FIG. 14) being transmitted through the inductor 291 in the Power Output Section 290 to increase in duration so as to deliver more power to both the Positive Signal Amplifier 320 and the Negative Signal Amplifier 330; and, thus raise the voltages supplied at the inductor's output terminal 292. On the other hand, when the amplitude of the audio signal is declining, the Comparator 310 detects that the difference in the signal between the Steering Network 230 and the signal from the Power Output Feedback circuit 300 is smaller. Therefore, the control signal 311 (FIG. 10) transmitted by the Comparator 310 to the Ramp Time Modulator 270 will be at a lower voltage level. This shortens the duration of the current pulses through the inductor 291, causing less power to be delivered to both the Positive Signal Amplifier 320 and the Negative Signal Amplifier 330.

Those skilled in the art will readily appreciate from the foregoing description that the Comparator 310 will, in effect, "track" the audio signal to maintain the voltage level impressed upon the power output terminal 292 and which is being routed via line 295 to respective ones of the Positive Signal Amplifier 320 and the Negative Signal Amplifier 330 so that the voltage level is varied in such a manner that it remains only moderately above the power requirements of the Amplifiers 320, 330. In actual practice, there is generally a voltage drop across the output transistors Q15, Q16 (FIG. 21) of the Positive Signal Amplifier 320, as well as the output transistors Q22, Q23 (FIG. 22) of the Negative Signal Amplifier 330, of approximately six volts (6v.).

Contributing to the small size of the subwoofer 50 (FIG. 1) of the present invention is the fact that the Power Supply 240 (FIGS. 5 and 20) does not require massive storage capacitors as do the power supplies used in prior art subwoofers. Because the Power Supply 240 employed with the present invention can deliver large amounts of power to both the Positive Signal Amplifier 320 and the Negative Signal Amplifier 330 so quickly, only a small amount of power need be held in reserve for sudden increases in the power demanded by the audio signal. Such sudden increases might, for example, be caused by a musical or other audio transient such as a loud drum beat or a film special effect such as an explosion.

Because the Power Supply 240 used in the subwoofer 50 of the present invention reacts so quickly to transients, only a relatively small storage capacitor C1—viz., a 6.8 microfarad capacitor rather than the 10,000 microfarad capacitors typically used in the prior art—is needed for supplying the power necessitated by a rapid increase in the power requirements of the Amplifiers 320, 330. The reason for this is that the power pulses 281 (FIG. 14) through the inductor 291 are of such high frequency, and the response time of the inductor 291 to such increases in power pulse duration (and, thus, the corresponding increase in power supplied) so fast, that the inductor 291 can respond in a matter of a fraction of a millisecond to begin delivering full power to the Amplifiers 320, 330. Thus, large 10,000 microfarad storage capacitors such as typically used in the prior art for supplying power for transients are not necessary. Since a smaller storage capacitor C1 (FIG. 5) can be used, the cabinet 51 of the subwoofer 50 (FIG. 1) can be made significantly smaller than the cabinets of prior art subwoofers.

Figure 15:
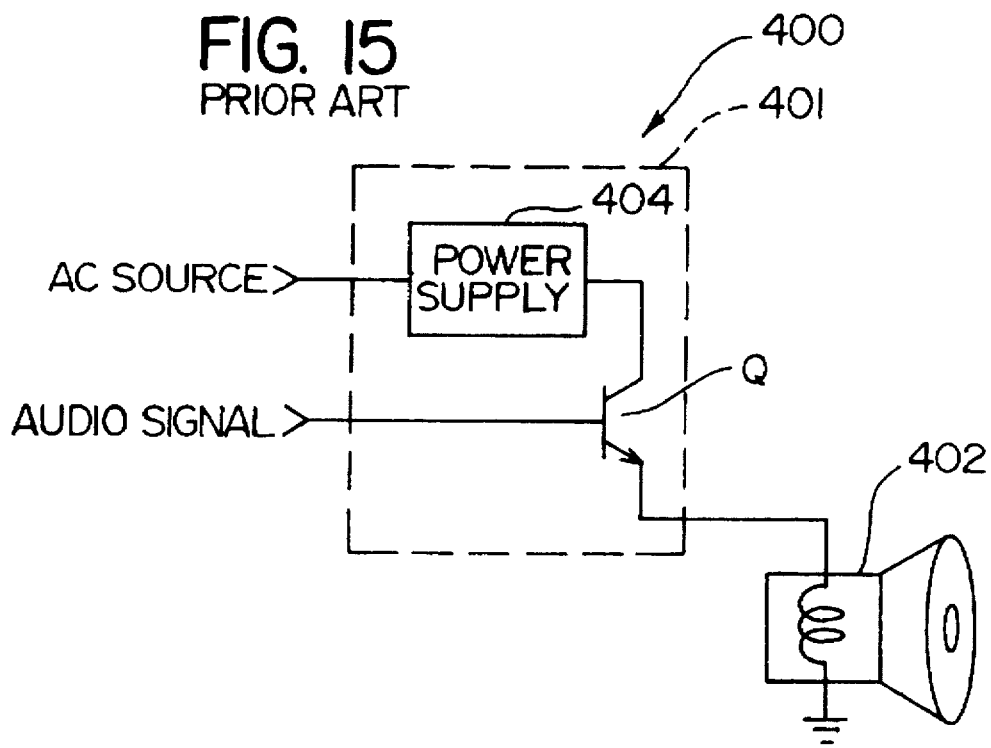
FIG. 15 is a simplified schematic drawing, here depicting a typical prior art subwoofer system.

Another advantage provided by the subwoofer 50 of the present invention is that the amplifier therein is very efficient when compared to prior art subwoofers such, for example, as the prior art subwoofer 400 depicted in FIG. 15. Thus, a typical amplifier 401 used in a conventional prior art subwoofer 400 requires the use of large heat sinks (not shown) to dissipate the heat generated by the output transistors Q. The reason for this has to do with conventional amplifier design. More specifically, in conventional amplifiers such as indicated at 401 in FIG. 15, the output voltage would generally be on the order of ninety volts. When the amplifier 401 is driving the load—i.e., the driver 402—the amplifier 401 only uses the voltage required by the driver 402 to produce the appropriate audio volume. If that voltage is less than the voltage provided by the power supply 404—which it almost always will be—the remainder of that voltage must be dissipated in the output transistors Q. Thus, if the audio signal requires that the driver 402 be driven with 30 volts, the remaining 60 volts multiplied by the load current must be dissipated in the form of heat by the output transistors Q. If a transistor Q is conducting ten amperes of current, the transistor is dissipating six hundred watts of power in the form of heat. To avoid failure of the output transistors Q, they must be mounted on large heat sinks which aid in the heat dissipation. A further problem, however, is that most output transistors Q are rated at only two hundred watts. Consequently, the output of these devices will be current limited. This will, therefore, require the use of many output transistors Q, each requiring a large heat sink and, therefore, the size of the subwoofer 400 will inherently be substantially increased.

In contrast to prior art subwoofers, the output of the Tracking Downconverter Power Supply 240 is fixed at a much lower voltage than the power supplies used in the prior art. For example, in the exemplary embodiment of the subwoofer 50 of the present invention, the output of the Power Supply 240 is maintained at six volts above the voltage required by the Positive Signal Amplifier 320 and the Negative Signal Amplifier 330. Thus, when no audio signal is being amplified, only six volts appears across the output transistors Q15, Q16 (FIG. 21) and Q22, Q23 (FIG. 22) of respective ones of the Positive Signal Amplifier 320 and the Negative Signal Amplifier 330. Further, using the example from above, if the driver 100 of the present invention requires 30 volts to produce the desired volume of sound, the Power Supply 240 will output only thirty six volts. Thus, the output transistors Q15, Q16 (FIG. 21) and Q22, Q23 (FIG. 22) used in respective ones of the Positive Signal Amplifier 320 and the Negative Signal Amplifier 330 of the present invention will still have to dissipate only six volts (6v.) times the load current. Because typical output transistors can dissipate 200 watts, each output transistor Q15, Q16 and Q22, Q23 can, theoretically, output over 30 amperes of current. In reality, typical output transistors can output only 20 amperes of current without failure. Thus, at a maximum, the output transistors Q15, Q16 (FIG. 21) and Q22, Q23 (FIG. 22) used in respective ones of the Positive Signal Amplifier 320 and the Negative Signal Amplifier 330 will have to dissipate only approximately 80 watts of power as heat. Because of this substantially reduced power dissipation in the output transistors, the subwoofer 50 of the present invention does not require large heat sinks as do prior art subwoofers. This further contributes to the reduced size of the subwoofer 50 (FIG. 1) of the present invention.

In carrying out the present invention, and as best illustrated in FIG. 16, a typical schematic circuit for the exemplary Input Circuit 200 to the subwoofer 50 has been depicted. The operation of the exemplary Input Circuit 200, previously described in block form in connection with FIG. 4, will be apparent to persons of ordinary skill in the art and, therefore, need not be discussed in detail. Rather, it should suffice to point out that the illustrative Input Circuit 200 includes an optical coupler, generally indicated at 202, comprising a light-emitting diode LED1 and a light-sensitive transistor Q1. In this exemplary embodiment, the optical coupler 202 may simply comprise a CNY-17 optical coupler of the type available from, for example, Motorola or any equivalent optical coupler available from any of numerous other component manufacturers. The audio signal is provided to the Input Circuit 200 at input terminal 59 (FIGS. 1, 4 and 16). The signal passes through capacitor C2 which serves to remove the D.C. component of the signal; and, then enters the optical coupler 202. Resistors R1 and R2 provide biasing current for the light-emitting diode LED1, while resistors R3 and R4 provide biasing current for the transistor Q1. A capacitor C3 is provided to prevent oscillation. The output of the optical coupler 202 is transmitted to the Low Pass Filter 210 (FIGS. 4 and 17) via output line 201, while capacitor C4 serves to remove any D.C. component from the output signal.

An Input Circuit 200 which utilizes an optical coupler 202 to isolate the input and output sides of the circuitry in accordance with the present invention can be used because all of the electronics of the subwoofer 50 can be placed in a sealed cabinet 51 (FIG. 1). Thus, large, heavy and expensive isolating transformers like those used in prior art power amplifiers are not necessary. This allows for use of a Power Supply 240 having only an inductor 291 instead of a larger and costlier isolating transformer. This further adds to the small size of the subwoofer 50.

Turning next to FIG. 17, a schematic circuit diagram for an exemplary Low Pass Filter 210, previously described in block form in connection with FIG. 4, has been depicted. As with the exemplary Input Circuit 200 depicted in FIG. 16, the operation of the Low Pass Filter's circuitry 210 will be apparent to persons of ordinary skill in the art and need not, therefore, be discussed in detail. Suffice it to say that the signal input on line 201 from the Input Circuit 200 is processed by an integrator comprising resistors R5, R6 and capacitors C5, C6 to strip the unwanted higher frequency components from the signal. The desired low frequency components of the signal are then amplified by operational amplifier 212 and output to the Servo Device 220 (FIGS. 4 and 18) via line 211.

Referring now to FIG. 18, a schematic circuit diagram for an exemplary Servo Device 220 (FIGS. 4 and 18) has been illustrated. Once again, the operation of the Servo Device 220 will be apparent to persons of ordinary skill in the art and need not, therefore, be discussed in detail. Briefly, however, it will be noted that the signal output from the Low Pass Filter 210 (FIG. 17) via line 211 is presented as one of two inputs to an operational amplifier 223 which functions as a mixer amplifier. Operational amplifier 223 derives its second input from the signals output from the accelerometer 148 via line 149 (FIGS. 2, 4 and 18). More specifically, the signals output from the accelerometer 148 on line 149 are presented to a first integrator comprising capacitor C7 and resistors R7, R8. The thus integrated signal forms one input to an operational amplifier 224 whose gain is controlled by resistor R9 and variable resistor VR1 forming a feedback loop from the output of operational amplifier 224 to a second input thereto. The output signal from the operational amplifier 224 is then presented as a second input to the operational mixer amplifier 223 with resistors R10 and R11 serving to control the gain of the mixer amplifier 223. The signal output from the operational mixer amplifier 223 is then presented to a second integrator circuit comprising resistors R12, R13 and capacitor C8, with the output from the Servo Device 220 being transmitted to the Steering Network 230 (FIGS. 4 and 19) via line 221.

A schematic circuit diagram for an exemplary Steering Network 230 embodying features of the present invention has been shown in FIG. 19. As was the case with the Input Circuit 200, Low Pass Filter 210 and Servo Device 220, the operation of the exemplary Steering Network 230 will be apparent to persons of ordinary skill in the art and need not, therefore, be discussed in detail. Briefly, however, the signal input to the Steering Network 230 from the Servo Device 220 on line 221 is presented to a voltage divider network comprising resistors R14, R15, R16 and R17. Diodes D2 and D3 are provided for respectively steering the positive components of the signal to: i) the Positive Signal Amplifier 320 via line 237a; and ii), the Power Supply 240 via line 231. Similarly, the negative components of the signal are steered by respective ones of diodes D4 and D5 to: i) the Negative Signal Amplifier 330 via line 237b; and ii), the Power Supply 240 via line 231.

Figure 20:
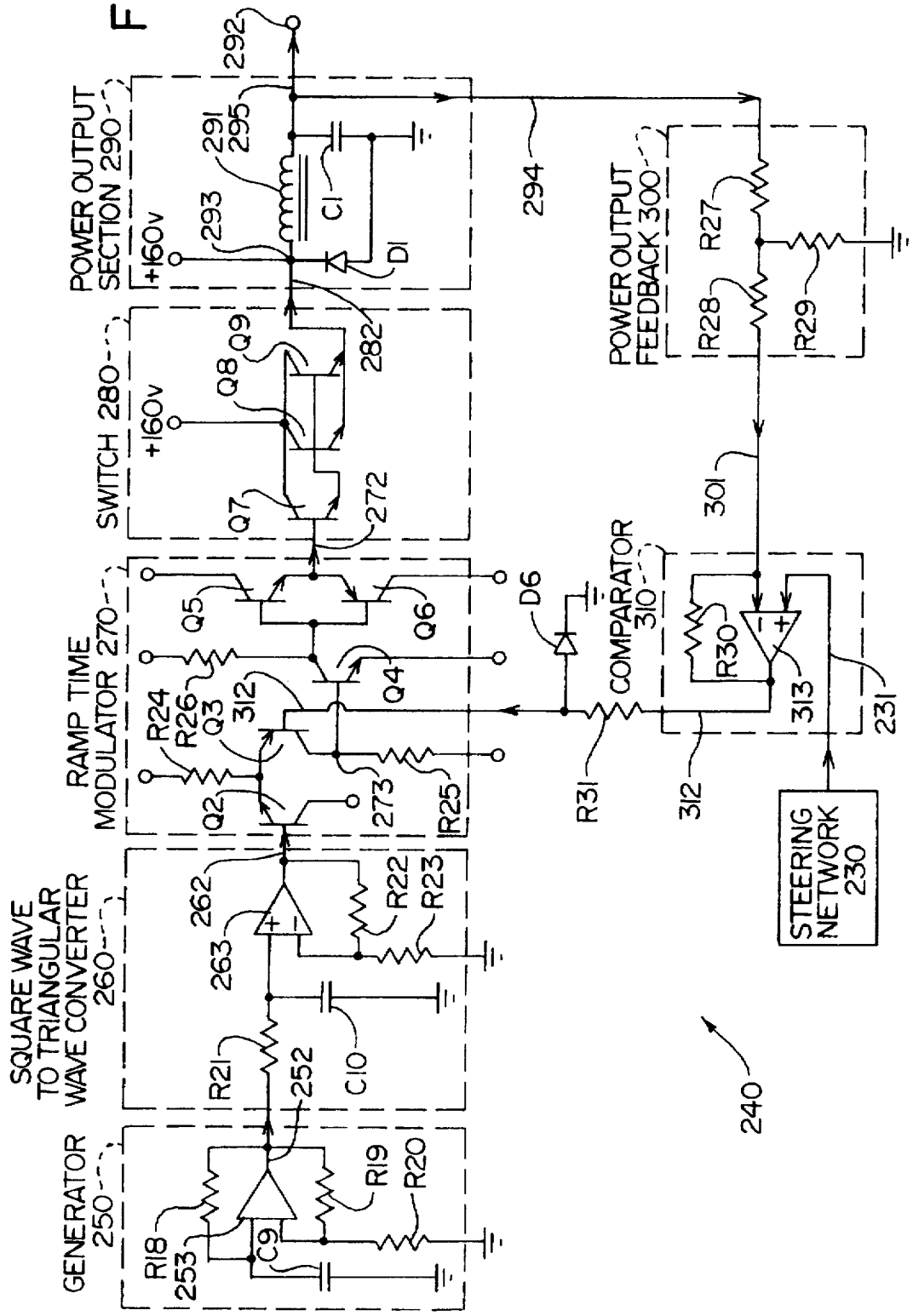
FIG. 20 is a schematic circuit drawing depicting circuit details of an exemplary Tracking Downconverter Power Supply used with the present invention.

Referring now to FIG. 20, an exemplary Tracking Downconverter Power Supply 240 has been illustrated which is especially advantageous for use with the present invention. Those persons skilled in the art will readily understand the exemplary architectural structure depicted and the mode of operation of the illustrative Power Supply; and, therefore, a detailed description thereof is not necessary. Indeed, a power supply having a substantially similar architectural structure and operational mode has been more fully described in the aforesaid U.S. Pat. No. 4,218,660 issued to Robert W. Carver; and, those interested in such specific details are referred to the aforesaid patent whose disclosure is incorporated herein by reference.

Briefly, and as previously noted, it will be seen upon inspection of FIG. 20 that the exemplary Power Supply 240 includes: i) a Pulse Generator 250; ii) a Square Wave To Triangular Wave Converter 260; iii) a Ramp Time Modulator 270; iv) a Switch 280; v) a Power Output Section 290 including an inductor 291; vi) a Power Output Feedback circuit 300; and vii), a Comparator 310, the structure and operation of each of which will be described below.

Figure 10:
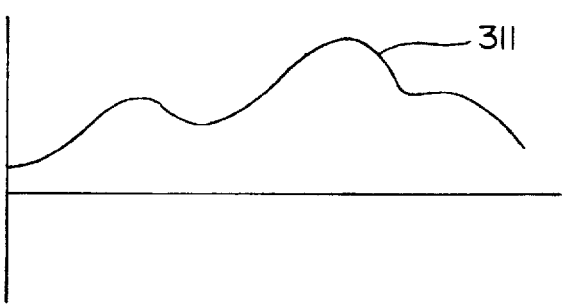
FIG. 10 is a graphic representation of the control signal output from the Comparator and input to the Ramp Time Modulator in the Tracking Downconverter Power Supply shown in FIG. 5.

The illustrative Pulse Generator 250 may comprise any of numerous commercially available pulse generators such, for example, as a Fairchild U.S. 78540 pulse generator. As here shown, the Pulse Generator 250 includes an operational amplifier 253 having a pair of resistances R18, R19 provided as a feedback loop. One input terminal of the operational amplifier 253 is coupled to one plate of a capacitor C9 having its other plate coupled to ground. The second input terminal to the operational amplifier 253 is coupled to ground through resistor R20. As is typical with this type of conventional Pulse Generator 250, the output of the operational amplifier 253 comprises a square wave pulse train 251 such as shown in FIG. 10; and, that output is coupled to the Square Wave To Triangular Wave Converter 260 via line 252.

The square wave pulses 251 (FIG. 10) input to the Square Wave To Triangular Wave Converter 260 on line 252 are presented to an integrator comprising resistor R21 and capacitor C10 which serve to convert the square wave 251 to a triangular wave 261 (FIG. 11) which is presented to one input terminal of an operational amplifier 263. Resistors R22, R23 serve to set the gain of amplifier 263. The thus amplified triangular waveform 261 (FIG. 11) is then output via line 262 to the Ramp Time Modulator 270.

In carrying out the present invention, the Ramp Time Modulator 270 may, merely by way of example, comprise a differential amplifier of completely conventional design such as a TLO72 amplifier of the type manufactured by Texas Instruments. As here shown, the Modulator 270 includes a pair of transistors Q2, Q3 which serve to compare the two voltages directed to their respective bases and to cause whichever transistor Q2, Q3 has the lowest input to conduct. The emitters of the transistors Q2, Q3 are connected to a positive voltage source through a bias resistor R24. Thus, for purposes of illustration, let it be assumed that the waveform depicted in FIG. 8 is imposed on the base of transistor Q2, while the control signal 311 of FIG. 10 is imposed on the base of transistor Q3. In this instance, those portions of the triangular shaped wave which are above the control signal voltage will cause transistor Q3 to be conductive. The collector of transistor Q3 is coupled through resistor R25 to a negative voltage source, with the resistance of biasing resistor R24 being substantially greater than the resistance of resistor R25. The effect of this is that when transistor Q3 is non-conductive, the point 273 located between transistor Q3 and Resistor R25 goes negative, causing transistor Q4 to become conductive. That, in turn, causes transistor Q5 to become conductive and transistor Q6 to become non-conductive. Resistor R26 is a biasing resistor for transistor Q4. Thus, the output from the Ramp Time Modulator 270 comprises a series of pulses, with the duration of each pulse coinciding with that portion of the triangular shaped wave of FIG. 12 which is below the voltage control signal 311. As previously indicated, the output of the Ramp Time Modulator 270 is represented at 281 in FIG. 14; and, that output is conveyed to the Switch 280 via line 272.

Switch 280 comprises a first transistor Q7 having its emitter output coupled to the bases of parallel configured transistors Q8, Q9. Thus, when transistor Q7 becomes conductive, it causes transistors Q8, Q9 to become conductive, thus causing a current pulse to be output on line 282 which is transmitted as an input to the Power Output Section 290.

As current pulses are input to the Power Output Section 290 and the inductor 291 therein on line 282 comprising the output from the Switch 280, the diode D1 completes the circuit path so that current continues to flow into the load via output terminal 292 during OFF time periods of the Switch 280. Capacitor C1—viz., only a 6.8 microfarad capacitor—insures sufficient power is available for the Amplifiers 320, 330 at output terminal 292 when the audio signal comprises a momentary transient of the type encountered from drum beats, explosions, and like sound occurrences in the input signal.

In order to provide a suitable control signal 311 (FIG. 10) on the output line 312 from the Comparator 310, which signal is used to modulate the audio signal passing through the Ramp Time Modulator 270, the output of the inductor 291 is conveyed via line 294 to the Power Output Feedback circuit 300 comprising a voltage divider network consisting of resistors R27, R28 and R29. The voltage divider network serves to output a signal on line 301 comprising a portion of the output signal from the Power Output Section 290.

The signal on line 301 provides one input to an operational amplifier 313 in the Comparator 310, with the second input being derived from the Steering Network 230 (FIGS. 4 and 19) via line 231. Comparator 310 is provided with a feedback loop including resistor R30. Comparator 310 serves to adjust the output control signal 311 (FIG. 10) on line 312 so that it is related to the power requirements of the Amplifiers 320, 330. Such control signal 311 is conveyed via line 312 and buffer resister R31 as the input to the base of transistor Q3 in the Ramp Time Modulator 270. A diode D6 serves as a clamp to prevent signals above a certain value from being routed to the transistor Q3; and, such signals are passed by the diode D6 to ground.

Turning now to FIG. 21, a schematic circuit diagram representative of an exemplary Positive Signal Amplifier 320 has been illustrated which finds particularly advantageous use with the present invention. In this illustrative circuit, the signal output from the Steering Network 230 on line 237a is coupled directly to the base of transistor Q10 which forms part of a differential pair of transistors Q10, Q11. In this arrangement, the emitters of the transistors Q10, Q11 are coupled to a positive voltage source through a bias resistor R32, while the collector of transistor Q10 is coupled to ground through a collector load resistor R33, and the collector of transistor Q11 is coupled directly to ground. The input signal at the base of transistor Q10 is, after amplification, transmitted to the base of transistor Q12 which further amplifies the signal. Transistor Q12 has its collector coupled through load resistor R35 and diodes D7, D8 and D9 to a +160v. voltage source and its emitter coupled to ground through a biasing resistor R34. The collector of transistor Q12 is coupled to the bases of parallel configured transistors Q13, Q14 which have their emitters coupled together through a bias resistor R36. The emitters of the transistors Q13, Q14 are, in turn, coupled to the bases of respective ones of the pair of output driver transistors Q15, Q16 which have their emitters coupled to the output terminal 322 of the Positive Signal Amplifier 320 via line 145. The collectors of the transistors Q14, Q16 are each coupled to ground, while the collectors of transistors Q13, Q15 are coupled to the output terminal 292 of the Tracking Downconverter Power Supply 240 as shown in FIGS. 4 and 5, as well as in FIG. 21. Finally, a feedback loop is provided from the emitter output of driver transistors Q15, Q16 through a feedback compensation circuit comprising resistor R37 and capacitor C11 to the base of transistor Q11. Feedback resistor R38 serves to couple the base of transistor Q11 to ground; and, together with resistor R37, sets the gain of the Positive Signal Amplifier 320.

Finally, referring to FIG. 22, it will be noted that the Negative Signal Amplifier 330 depicted here in diagrammatic schematic circuit form is, from a structural architectural standpoint, essentially identical to the Positive Signal Amplifier 320 shown in FIG. 21 and described above. In this instance, however, there is one basic difference in the amplifier circuit—viz., the input signal from the Steering Network 230, which here appears on line 237b, is coupled through a gain-setting resistor R39 to the base of transistor Q18 comprising the second stage of a differential pair of transistors Q17, Q18 having their emitters coupled to a positive voltage source through biasing resistor 40, while the base of transistor Q17 is coupled to ground through a ground bias resistor R41.

The collector of transistor Q17—just as the collector of transistor Q10 in FIG. 21—is coupled to ground through a collector load resistor R42, while the collector of transistor Q18 is coupled directly to ground. The emitter of transistor Q19 is coupled to ground through a biasing resistor R43, while its collector is coupled to a positive voltage source through a biasing network comprising resistor R44 and diodes D10, D11, D12. The collector of transistor Q19 further provides an input to the base of parallel configured transistors Q20, Q21 which are identical in structure to transistors Q13, Q14 in FIG. 21, with transistors Q20, Q21 having their emitters coupled together through biasing resistor R45 and respectively coupled to respective different ones of a pair of output driver transistors Q22, Q23. The collectors of transistors Q21, Q23 are coupled to ground; the collectors of transistors Q20, Q22 are coupled to the output terminal 292 of the Tracking Downconverter Power Supply 240 as shown in FIGS. 4 and 5, as well as in FIG. 22; and, the emitters of the output driver transistors Q22, Q23 are coupled to the output terminal 332 of the Negative Signal Amplifier 330. As in the case of the Positive Signal Amplifier 320 shown in FIG. 21, a feedback loop is provided from the emitters of the output driver transistors Q22, Q23 through a feedback compensation circuit comprising resistor R46 and capacitor C12; with resistors R39 and R46 serving to set the gain of the Negative Signal Amplifier 330.

Thus, those skilled in the art will appreciate that there has hereinabove been described a subwoofer 50 (FIG. 1) which is characterized by: i) its extremely small size as contrasted with conventional prior art subwoofers—viz., a cabinet defining an enclosed volume of space only about $\frac{1}{15}$th to $\frac{1}{25}$th the volume of space required in conventional subwoofers—ii) a significantly greater peak-to-peak driver stroke—viz., about 2.5" as contrasted with only from about 0.6" to about 0.8" in the case of prior art subwoofers—iii) its high power output with acoustically accurate audio signals substantially devoid of distortion; iv) its extremely low power loss as a result of power dissipation through heat; v) its lack of a requirement for large storage capacitors—viz., its ability to use a single 6.8 microfarad storage capacitor as contrasted with prior art subwoofers which require 10,000 microfarad storage capacitors—and vi), its lightness in weight and portability, all attributable to the small compact cabinet and enclosed volume of space, the lack of large storage capacitors, the lack of heavy isolation transformers, and the elimination of the need for heavy heat sinks to facilitate dissipation.

Moreover, those persons skilled in the art will appreciate the foregoing advantages are, in effect, attained by employing: i) a driver 100 employing a suspension characterized by an edgeroll or surround 110 having a relatively large non-linear cross-sectional configuration and a spider 118 having a spring-type corrugated configuration, which components enable axial movement of the driver cone 101, voice coil former 116 and voice coils 122, 124 by a peak-to-peak stroke of approximately 2.5"; ii) a commutated voice coil configuration comprising two (2) separate and distinct, axially spaced apart, relatively short, coaxial voice coils 122, 124 wherein one voice coil—here voice coil 122—is energized during positive voltage swings of the audio signal and the other voice coil—here voice coil 124—is energized during negative voltage swings of the audio signal, thereby minimizing power loss through heat dissipation in the voice coil and contributing to the relatively large stroke and efficiency of the driver 100; and iii), a power supply 240 capable of delivering over 2,000 watts of power to the subwoofer 50 while dissipating only about 80 watts through heat loss, thereby eliminating the need for: a) large heavy power storage capacitors; b) large heavy heat sinks; and c), relatively large, heavy isolation transformers. As a consequence, the resulting subwoofer is not only characterized by its small size and compactness rendering it readily portable and useable in virtually any location desired by the user, but, additionally, the subwoofer is characterized by its significant power output virtually free of distortion, as well as faithful and accurate reproduction of relatively low frequency audio signals, and its economy.

Of course, those persons skilled in the art will appreciate that the specific schematic circuits described herein are not critical to the present invention and may be varied extensively by skilled electronic technicians and/or circuit designers provided only that the overall mode of operation as expressed in the appended claims is attained with any desired circuit modifications. Merely by way of example, while the exemplary circuit description has contemplated the use of +160v., −160v., +12v. and/or −12v. voltage sources, those skilled in the art will appreciate that such specific voltage values are for illustrative purposes only and may be varied widely without departing from the spirit and scope of the present invention.

I claim:

1. A high power audio subwoofer comprising, in combination:
   a) a subwoofer cabinet, said cabinet being formed by a plurality of walls defining an enclosed volume of space;
   b) an opening formed in at least one of said walls; and,
   c) a driver assembly mounted within said cabinet on an axis extending coaxially through said opening, said driver assembly including:
      i) means defining a driver frame fixedly mounted within said cabinet in coaxial surrounding relation to said axis;
      ii) means defining a stationary magnetic pole fixedly mounted within said cabinet relative to said driver frame defining means, said pole defining means having a circular cross-sectional configuration with a diameter D;
      iii) an annular magnet fixedly mounted on said driver frame surrounding and coaxial with said pole defining means, said magnet having an internal diameter greater than D and defining an annular magnetic gap between said pole defining means and said magnet;
      iv) a cylindrical voice coil former positioned coaxially within said magnetic gap with said former being axially moveable relative to said pole defining means;
      v) voice coil defining means wound about and affixed to said voice coil former and axially moveable within said magnetic gap upon axial movement of said voice coil former;
      vi) amplifier means for alternately delivering positive and negative voltage swings to said voice coil defining means to shift said voice coil former axially within said annular magnetic gap in a first axial direction responsive to positive voltage swings delivered from said amplifier means and in a second and opposite axial direction in response to negative voltage swings delivered from said amplifier means;
      vii) a driver cone having a large diameter end and a cylindrical apical end with said cylindrical apical end being affixed to one end of said cylindrical voice coil former and coaxial therewith, said cone extending axially beyond said pole defining means and having its large diameter end terminating in a plane at least closely proximate to said cabinet wall containing said opening, said cone's large diameter end having a maximum diameter less than the diameter of said opening; and,
      viii) means defining a flexible resilient suspension system supporting said driver cone on said driver frame in a normally null position wherein said large diameter end of said driver cone lies in said plane, said flexible resilient suspension system defining means including: a) a flexible resilient edgeroll having a cross-sectional configuration defining a curved central portion terminating in inwardly and outwardly projecting peripheral flanges wherein said inwardly projecting peripheral flange is secured to said large diameter end of said driver cone and said outwardly projecting peripheral flange is secured to the free end of said driver frame; and b), an annular spider resilient support element having inner and outer peripheral edges and a non-linear cross-sectional configuration, said outer peripheral edge being secured to said driver frame and said inner peripheral edge being secured to said voice coil former, said flexible resilient edgeroll and said annular spider resilient support providing the sole support for said driver cone, said voice coil former, and said voice coil defining means, and being dimensioned so as to permit said driver cone, said voice coil former, and said voice coil defining means to move axially inward from said null position by a stroke distance of approximately 1.25" and axially outward from said null position by a stroke distance of approximately 1.25" defining a peak-to-peak stroke for said driver assembly of approximately 2.5";

wherein, upon energization of said voice coil defining means by delivery of one or positive and negative voltage swings from said amplifier means, a first magnetic field is created causing said voice coil former to be axially shifted inwardly relative to said magnet so as to shift said driver core, said voice coil former and said voice coil defining means axially inward relative to said opening in said cabinet wall, and upon energization of said voice coil defining means by delivery of the other of positive and negative voltage swings from said amplifier means, a second magnetic field is created causing said voice coil former to be shifted axially outward relative to said magnet so as to shift said driver cone, said voice coil former and said voice coil defining means axially outward relative to said opening.

2. A high power audio subwoofer comprising, in combination:
   a) a subwoofer cabinet, said cabinet being formed by a plurality of walls defining an enclosed volume of space less than 1 cubic foot;
   b) an opening formed in at least one of said walls; and,
   c) a driver assembly mounted within said cabinet on an axis extending coaxially through said opening, said driver assembly including:
      i) means defining a driver frame fixedly mounted within said cabinet in coaxial surrounding relation to said axis;
      ii) means defining a stationary magnetic pole fixedly mounted within said cabinet relative to said driver frame defining means, said pole defining means having a circular cross-sectional configuration with a diameter D;
      iii) an annular magnet fixedly mounted on said driver frame surrounding and coaxial with said pole defining means, said magnet having an internal diameter greater than D and defining an annular magnetic gap between said pole defining means and said magnet;

iv) a cylindrical voice coil former positioned coaxially within said magnetic gap with said former being axially moveable relative to said pole defining means;

v) voice coil defining means wound about and affixed to said voice coil former and axially moveable within said magnetic gap upon axial movement of said voice coil former;

vi) amplifier means for alternately delivering positive and negative voltage swings to said voice coil defining means to shift said voice coil former axially within said annular magnetic gap in a first axial direction responsive to positive voltage swings delivered from said amplifier means and in a second and opposite axial direction in response to negative voltage swings delivered from said amplifier means;

vii) a driver cone having a large diameter end and a cylindrical apical end with said cylindrical apical end being affixed to one end of said cylindrical voice coil former and coaxial therewith, said cone extending axially beyond said pole defining means and having its large diameter end terminating in a plane at least closely proximate to said cabinet wall containing said opening, said cone's large diameter end having a maximum diameter less than the diameter of said opening; and, viii) means defining a flexible resilient suspension system supporting said driver cone on said driver frame in a normally null position wherein said large diameter end of said driver cone lies in said plane, said flexible resilient suspension system defining means including: a) a flexible resilient edgeroll having a cross-sectional configuration defining a curved central portion terminating in inwardly and outwardly projecting peripheral flanges wherein said inwardly projecting peripheral flange is secured to said large diameter end of said driver cone and said outwardly projecting peripheral flange is secured to the free end of said driver frame; and b), an annular spider resilient support element having inner and outer peripheral edges and a non-linear cross-sectional configuration, said outer peripheral edge being secured to said driver frame and said inner peripheral edge being secured to said voice coil former, said flexible resilient edgeroll and said annular spider resilient support providing the sole support for said driver cone, said voice coil former, and said voice coil defining means, and being dimensioned so as to permit said driver cone, said voice coil former, and said voice coil defining means to move axially inward from said null position by a stroke distance of approximately 1.25" and axially outward from said null position by a stroke distance of approximately 1.25" defining a peak-to-peak stroke for said driver assembly of approximately 2.5";

wherein, upon energization of said voice coil defining means by delivery of one of positive and negative voltage swings from said amplifier means, a first magnetic field is created causing said voice coil former to be axially shifted inwardly relative to said magnet so as to shift said driver cone, said voice coil former and said voice coil defining means axially inward relative to said opening in said cabinet wall, and upon energization of said voice coil defining means by delivery of the other of positive and negative voltage swings from said amplifier means, a second magnetic field is created causing said voice coil former to be shifted axially outward relative to said magnet so as to shift said driver cone, said voice coil former and said voice coil defining means axially outward relative to said opening.

3. A high power subwoofer as set forth in claim 1 wherein said at least one opening comprises a pair of coaxial openings formed in opposite ones of said walls and where two of said driver assemblies are coaxially mounted within said cabinet in opposite facing directions with said driver cone in each of said driver assemblies having its large diameter end terminating in a plane at least closely proximate to respective different ones of said cabinet walls.

4. A high power subwoofer as set forth in claim 2 wherein said at least one opening comprises a pair of coaxial openings formed in opposite ones of said walls and where two of said driver assemblies are coaxially mounted within said cabinet in opposite facing directions with said driver cone in each of said driver assemblies having its large diameter end terminating in a plane at least closely proximate to respective different ones of said cabinet walls.

5. A high power subwoofer as set forth in claim 1 wherein said amplifier means includes:

d) a positive signal amplifier mounted in said cabinet having an input and an output wherein said output is coupled to said voice coil defining means;

e) a negative signal amplifier mounted in said cabinet having an input and an output wherein said output is coupled to said voice coil defining means; and, f) a tracking downconverter power supply mounted in said cabinet, said power supply including means for outputting positive voltage swings in the audio signal being processed to said input of said positive signal amplifier for energizing said voice coil defining means to shift said driver cone, said voice coil former, and said voice coil defining means in a first axial direction within said annular magnetic gap, and for outputting negative voltage swings in the audio signal being processed to said input of said negative signal amplifier for energizing said voice coil defining means to shift said driver cone, said voice coil former, and said voice coil defining means in a second opposite axial direction within said annular magnetic gap.

6. A high power subwoofer as set forth in claim 2 wherein said amplifier means includes:

d) a positive signal amplifier mounted in said cabinet having an input and an output wherein said output is coupled to said voice coil defining means;

e) a negative signal amplifier mounted in said cabinet having an input and an output wherein said output is coupled to said voice coil defining means; and, f) a tracking downconverter power supply mounted in said cabinet, said power supply including means for outputting positive voltage swings in the audio signal being processed to said input of said positive signal amplifier for energizing said voice coil defining means to shift said driver cone, said voice coil former, and said voice coil defining means in a first axial direction within said annular magnetic gap, and for outputting negative voltage swings in the audio signal being processed to said input of sad negative signal amplifier for energizing said voice coil defining means to shift said driver cone, said voice coil former, and said voice coil defining means in a second opposite axial direction within said annular magnetic gap.

7. A high power subwoofer as set forth in claim 5 wherein said at least one opening comprises a pair of coaxial openings formed in opposite ones of said walls and where two of said driver assemblies are coaxially mounted within said cabinet in opposite facing directions with said driver cone in each of said driver assemblies having its large diameter end terminating in a plane at least closely proximate to respective different ones of said cabinet walls.

8. A high power subwoofer as set forth in claim 6 wherein said at least one opening comprises a pair of coaxial openings formed in opposite ones of said walls and where two of said driver assemblies are coaxially mounted within said cabinet in opposite facing directions with said driver cone in each of said driver assemblies having its large diameter end terminating in a plane at least closely proximate to respective different ones of said cabinet walls.

9. A high power audio subwoofer as set forth in claim 5 further including an audio signal processing system including: i) an audio input circuit for receiving the audio signal to be processed; ii) a low pass filter coupled to said audio input circuit for filtering out that portion of the audio signal having frequencies above a desired level; iii) a servo device coupled to said low pass filter for inversely modifying the audio input signal to remove distortion therefrom; iv) a steering network coupled to said servo device for steering positive and negative voltage signals to a power supply and for enabling respective ones of said positive and negative signal amplifiers during respective different ones of positive and negative voltage swings of the audio signal; v) a pulse generator for generating a square wave pulse waveform; vi) a square wave to triangular wave converter coupled to said pulse generator for converting the square wave output by said pulse generator to a triangular waveform; vii) a ramp time modulator coupled to said square wave to triangular wave converter for outputting a series of current pulses each having a duration coinciding with a desired portion only of each triangular pulse input to said ramp time modulator; viii) a switch connected to the output of said ramp time modulator and cycling between ON and OFF states with the duration of switch ON periods being identical to the duration of the pulses output from said ramp time modulator; ix) a power supply including an inductor and a storage capacitor coupled to the output of said switch; x) a power feedback circuit for establishing a feedback loop between the output of said power supply and said ramp time modulator; xi) a comparator interposed in said feedback loop for comparing the voltage level of the output signals from said power supply and the output signals from said steering network and delivering a control signal to said ramp time modulator which is imposed on the triangular wave form being processed therethrough so as to control the duration of pulses output from said ramp time modulator and the duration of switch ON periods; and, xii) means for conveying the signals output from said power supply to said positive and negative signal amplifiers with said amplifiers outputting energizing signals to said voice coil defining means only when said amplifiers are alternately enabled by positive and negative voltage swings in said audio signal as output from said steering network.

10. A high power audio subwoofer as set forth in claim 6 further including an audio signal processing system including: i) an audio input circuit for receiving the audio signal to be processed; ii) a low pass filter coupled to said audio input circuit for filtering out that portion of the audio signal having frequencies above a desired level; iii) a servo device coupled to said low pass filter for inversely modifying the audio input signal to remove distortion therefrom; iv) a steering network coupled to said servo device for steering positive and negative voltage signals to a power supply and for enabling respective ones of said positive and negative signal amplifiers during respective different ones of positive and negative voltage swings of the audio signal; v) a pulse generator for generating a square wave pulse waveform; vi) a square wave to triangular wave converter coupled to said pulse generator for converting the square wave output by said pulse generator to a triangular waveform; vii) a ramp time modulator coupled to said square wave to triangular wave converter for outputting a series of current pulses each having a duration coinciding with a desired portion only of each triangular pulse input to said ramp time modulator; viii) a switch connected to the output of said ramp time modulator and cycling between ON and OFF states with the duration of switch ON periods being identical to the duration of the pulses output from said ramp tine modulator; ix) a power supply including an inductor and a storage capacitor coupled to the output of said switch; x) a power feedback circuit for establishing a feedback loop between the output of said power supply and said ramp time modulator; xi) a comparator interposed in said feedback loop for comparing the voltage level of the output signals from said power supply and the output signals from said steering network and delivering a control signal to said ramp time modulator which is imposed on the triangular wave form being processed therethrough so as to control the duration of pulses output from said ramp time modulator and the duration of switch ON periods; and, xii) means for conveying the signals output from said power supply to said positive and negative signal amplifiers with said amplifiers outputting energizing signals to said voice coil defining means only when said amplifiers are alternately enabled by positive and negative voltage swings in said audio signal as output from said steering network.

11. A high power audio subwoofer as set forth in claim 9 further including an accelerator device mounted on said driver cone for sensing non-linear distorted movement of said cone and for inputting a signal to said servo device for inversely modifying the audio signal being processed so as to produce non-linear audio inputs to said amplifiers which result in non-distorted linear movement of said voice coil former, said voice coil defining means, and said driver cone.

12. A high power audio subwoofer as set forth in claim 10 further including an accelerator device mounted on said driver cone for sensing non-linear distorted movement of said cone and for inputting a signal to said servo device for inversely modifying the audio signal being processed so as to produce non-linear audio inputs to said amplifiers which result in non-distorted linear movement of said voice coil former, said voice coil defining means, and said driver cone.

13. A high power audio subwoofer as set forth in claim 9 wherein said storage capacitor is on the order of only about 6.8 microfarads.

14. A high power audio subwoofer as set forth in claim 10 wherein said storage capacitor is on the order of only about 6.8 microfarads.

15. A driver for use with a high power audio subwoofer of the type having a cabinet formed by a plurality of walls defining an enclosed volume of space with a driver opening formed in at least one of the cabinet walls, said driver comprising, in combination:

a) a first stationary driver subassembly adapted to be fixedly mounted in the subwoofer cabinet and including: i) a driver base; ii) an annular magnet having an internal diameter D mounted on said base; iii) a magnetic pole having an external diameter less than D mounted on said driver base and coaxial with said magnet with said magnet and said pole defining an annular magnetic gap therebetween; and iv), a driver frame fixedly mounted on said magnet and extending axially beyond said magnetic pole and coaxial therewith;

b) a second driver subassembly adapted to be coaxially mounted on said first stationery driver subassembly with freedom for axial movement relative thereto, said second driver subassembly including: v) a cylindrical voice coil former dimensioned to be coaxially received within said magnetic gap and axially moveable with respect thereto; vi) voice coil defining means wound about said voice coil former and affixed thereto with said voice coil defining means being dimensioned so as to be axially moveable within said magnetic gap; and vii), a driver cone having a funnel-shaped configuration defining a large diameter end and a cylindrical small diameter apical end, with said small diameter apical end being coaxial with and affixed to one end of said cylindrical voice coil former and said large diameter end lying in a plane adapted to be positioned substantially in the plane containing the opening in the subwoofer's cabinet wall;

c) a flexible resilient suspension system for resiliently attaching said second driver subassembly to said first driver subassembly; said flexible resilient suspension system including: viii) a flexible resilient edgeroll having a cross-sectional configuration defining a curved central portion terminating in inwardly and outwardly projecting peripheral flanges wherein said inwardly projecting peripheral flange is secured to said large diameter end of said driver cone and said outwardly projecting peripheral flange is secured to the free end of said driver frame; and ix), an annular spider resilient support element having inner and outer peripheral edges and a non-linear cross-sectional configuration, said outer peripheral edge being secured to said driver frame and said inner peripheral edge being secured to said voice coil former, said flexible resilient edgeroll and said annular spider resilient support providing the sole support for said driver cone, said voice coil former, and said voice coil defining means, and being dimensioned so as to permit said voice coil former, said voice coil defining means, and said driver cone to move axially outward relative to a null position through a driver stroke of approximately 1.25" and axially inward relative to a null position through a driver stroke of approximately 1.25"; and, d) amplifier means for alternately energizing said voice coil defining means to create magnetic fields within said magnetic gap for alternately attracting and repelling said voice coil defining means, with said energizing means being capable of: x) energizing said voice coil defining means during positive swings of an audio signal to cause one of PUSH/PULL movements of said second driver subassembly relative to said first driver subassembly through a driver stroke of approximately 1.25"; and xi), energizing said voice coil defining means during negative swings of an audio signal to cause the other of PUSH/PULL movements or said second driver subassembly relative to said first driver subassembly through a driver stroke of approximately 1.25" whereby such second driver subassembly moves relative to said first drive subassembly through a peak-to-peak driver stroke of approximately 2.5".

16. A moveable driver subassembly for use with a stationary driver of the type used in an audio subwoofer wherein the stationary driver includes a frame, a pole mounted coaxially within the frame, and an annular magnet mounted on the frame in surrounding relationship to the pole and defining an annular magnetic gap therebetween, said driver subassembly comprising, in combination:

a) a cylindrical voice coil former dimensioned to be received within the magnetic gap intermediate the pole and the magnet of the stationary driver with freedom for axial movement therebetween;

b) voice coil defining means wound about and secured to said voice coil former;

c) a funnel-shaped driver cone having a large diameter end and a small diameter cylindrical apical end, said cylindrical apical end being secured to one end of said voice coil former with said driver cone adapted to project axially beyond the pole of the driver and wherein said driver cone, said voice coil former and said voice coil defining means are axially moveable as a unit; and, d) resilient flexible suspension means for securing said large diameter end of said driver cone and said voice coil former to the driver frame with freedom for axial movement relative thereto, said resilient flexible suspension means including : i) a flexible resilient edgeroll having a cross-sectional configuration defining a curved central portion terminating in inwardly and outwardly projecting peripheral flanges wherein said inwardly projecting peripheral flange is secured to said large diameter end of said driver cone and said outwardly projecting peripheral flange is secured to the free end of said driver frame; and ii), an annular spider resilient support element having inner and outer peripheral edges and a non-linear cross-sectional configuration, said outer peripheral edge being secured to said driver frame and said inner peripheral edge being secured to said voice coil former, said flexible resilient edgeroll and said annular spider resilient support providing the sole support for said driver cone, said voice coil former and said voice coil defining means, and being dimensioned so as to permit said driver cone, said voice coil former, and said voice coil defining means to move axially inward from said null position by a distance of approximately 1.25" and axially outward from said null position by a distance of approximately 1.25" defining a peak-to-peak stroke for said driver assembly of approximately 2.5";

wherein, upon assembly of said driver subassembly with the stationary driver frame, pole and magnet and alternate energization of said voice coil defining means by alternate delivery of positive and negative voltage swings thereto, said driver subassembly reciprocates axially within the driver through a peak-to-peak stroke of approximately 2.5".

17. The method of processing low frequency audio signals with high power and accuracy comprising the steps of:

a) forming a subwoofer cabinet having a plurality of walls defining an enclosed volume of space with a driver opening formed in at least one cabinet wall;

b) mounting a driver assembly within the cabinet coaxially with the axis of the opening formed in the at least one cabinet wall, with the driver assembly including:

i) a fixed stationary frame, a fixed magnetic pole mounted coaxially within the driver assembly, and an annular magnet coaxially surrounding the magnetic pole and spaced therefrom so as to define an annular magnetic gap; and, ii) an axially moveable driver subassembly including a cylindrical voice coil former having voice coil defining means wound thereabout and fixed thereto and a driver cone mounted on one end of the cylindrical voice coil former and terminating in a plane at least closely proximate to the wall containing the driver opening therein with the voice coil former and the voice coil defining means being axially moveable within the magnetic gap and the driver cone being axially moveable therewith through a peak-to-peak stroke of about 2.5" from a null position mid-way between the limits of the driver stroke; and, c) resiliently suspending the movable driver subassembly from the fixed stationery frame by employing: i) a flexible resilient edgeroll having a cross-sectional configuration defining a curved central portion terminating in inwardly and outwardly projecting peripheral flanges wherein the inwardly projecting peripheral flange is secured to the large diameter end of the driver cone and the outwardly projecting peripheral flange is secured to the free end of the driver frame; and ii), an annular spider resilient support element having inner and outer peripheral edges and a nonlinear cross-sectional configuration, the outer peripheral edge being secured to the driver frame and the inner peripheral edge being secured to the voice coil former, the flexible resilient edgeroll and the annular spider resilient support providing the sole support for the driver cone, the voice coil former, and the voice coil defining means, and being dimensioned so as to permit the driver cone, the voice coil former, and the voice coil defining means to move axially inward from the null position by a stroke distance of approximately 1.25" and axially outwardly from the null position by a stroke distance of approximately 1.25" defining a peak-to-peak stroke for the driver assembly of approximately 2.5";

d) delivering positive voltage swings to the voice coil defining means to create a first magnetic field causing the voice coil former, the voice coil defining means, and the driver cone to move in a first axial direction through a stroke of about 1.25"; and, e) delivering negative voltage swings to the voice coil defining means to create a second magnetic field causing the voice coil former, the voice coil defining means and the driver cone to move in a second opposite axial direction through a stroke of about 1.25";

whereby, upon alternate energization of the voice coil defining means in response to positive and negative voltage swings of an audio signal, the axially moveable driver assembly is reciprocated with a PUSH/PULL or OUT/IN movement through a peak-to-peak stroke of approximately 2.5".

* * * * *